(12) United States Patent
Wada et al.

(10) Patent No.: US 8,963,163 B2
(45) Date of Patent: Feb. 24, 2015

(54) SEMICONDUCTOR DEVICE

(75) Inventors: Keiji Wada, Osaka (JP); Hideto Tamaso, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/131,163

(22) PCT Filed: Jul. 8, 2010

(86) PCT No.: PCT/JP2010/061613
§ 371 (c)(1),
(2), (4) Date: May 25, 2011

(87) PCT Pub. No.: WO2011/043116
PCT Pub. Date: Apr. 14, 2011

(65) Prior Publication Data
US 2011/0227096 A1 Sep. 22, 2011

(30) Foreign Application Priority Data

Oct. 5, 2009 (JP) .................................. 2009-231647

(51) Int. Cl.
*H01L 21/04* (2006.01)
*H01L 29/66* (2006.01)
(Continued)

(52) U.S. Cl.
CPC ...... *H01L 29/66068* (2013.01); *H01L 21/0445* (2013.01); *H01L 21/045* (2013.01); *H01L 21/0485* (2013.01); *H01L 29/7802* (2013.01); *H01L 29/1608* (2013.01); *H01L 29/45* (2013.01)
USPC ..................... 257/77; 257/E29.084

(58) Field of Classification Search
CPC .................. H01L 21/0445; H01L 21/0485

USPC ............................................ 257/77, E29.084
See application file for complete search history.

(56) References Cited

U.S. PATENT DOCUMENTS 6,214,724 B1 4/2001 Nakajima
6,686,616 B1 2/2004 Allen et al.
(Continued)

FOREIGN PATENT DOCUMENTS

CN 1441965 A 9/2003
JP 10-173169 A 6/1998
(Continued)

OTHER PUBLICATIONS

Machine Translation of JP 2008-192691 (Matsuki) which was provided by applicant in a previous IDS.*
(Continued)

*Primary Examiner* — Amar Movva
(74) *Attorney, Agent, or Firm* — Venable LLP; Michael A. Sartori; Tamatane J. Aga

(57) ABSTRACT

A semiconductor device having a construction capable of achieving suppressed deterioration of electric characteristics in an insulating member is provided. An $n^-$ SiC layer, a source contact electrode formed on a main surface of the $n^-$ SiC layer, a gate electrode arranged at a distance from the source contact electrode on the main surface of the $n^-$ SiC layer, and an interlayer insulating film located between the source contact electrode and the gate electrode are provided. A rate of lowering in electric resistance in the interlayer insulating film when heating to a temperature not higher than 1200 °C. is carried out while the source contact electrode and the interlayer insulating film are adjacent to each other is not higher than 5%.

6 Claims, 25 Drawing Sheets

(51) Int. Cl.
*H01L 29/78* (2006.01)
*H01L 29/16* (2006.01)
*H01L 29/45* (2006.01)

(56) References Cited

U.S. PATENT DOCUMENTS

| | | | |
|---|---|---|---|
| 2004/0159865 | A1 | 8/2004 | Allen et al. |
| 2010/0055858 | A1 | 3/2010 | Hayashi et al. |

FOREIGN PATENT DOCUMENTS

| | | |
|---|---|---|
| JP | 2000-012846 A | 1/2000 |
| JP | 2002-093742 A | 3/2002 |
| JP | 2004-288890 A | 10/2004 |
| JP | 2005-276978 A | 10/2005 |
| JP | 2008-192691 A | 8/2008 |
| WO | WO-96/22611 A1 | 7/1996 |
| WO | WO-2009/013886 A1 | 1/2009 |

OTHER PUBLICATIONS

Tanimoto et al., "Practical Device-Directed Ohmic contacts on 4H-SiC," IEICE Transactions C, The Institute of Electronics, Information and Communication Engineers, vol. J86-C, No. 4, pp. 359-367 (2003).
Extended European Search Report issued in European Patent Application No. 10821787.8 dated Dec. 3, 2013.
Notification of the First Office Action issued in Chinese Patent Application No. 201080003346.7 dated May 6, 2014.

* cited by examiner

SEMICONDUCTOR DEVICE

TECHNICAL FIELD

The present invention relates to a semiconductor device and more particularly to a semiconductor device capable of maintaining insulation between layers.

BACKGROUND ART

A semiconductor device for handling high power is generally referred to as a power device. In order to handle high power, the semiconductor device is desired to achieve a higher withstand voltage and lower loss and to enable use thereof in an environment at a high temperature and the like. Therefore, silicon carbide (SiC) has recently increasingly been adopted as a material for forming a semiconductor device. SiC is a wide-bandgap semiconductor greater in bandgap than silicon (Si) that has conventionally widely been used as a material for forming a semiconductor device. Therefore, by adopting SiC as a material for forming a semiconductor device, a higher withstand voltage, a lower ON resistance and the like of a semiconductor device can be achieved. In addition, a semiconductor device adopting SiC as a material is also advantageous in that lowering in characteristics when used in an environment at a high temperature is less likely than in a semiconductor device adopting Si as a material.

Among power devices in particular, a vertical SiC-MOSFET high in switching speed and high in conversion efficiency in a low voltage region is effectively made use of as a semiconductor device for large machinery requiring particularly high switching characteristics, such as electric power conversion equipment used, for example, for a hybrid car.

In adopting SiC as a material for a semiconductor device, however, it is not easy to form ohmic contact low in contact resistance between an n-type region, a p-type region and an electrode formed in contact with the n-type region or the p-type region, as compared with an example where Si is adopted as a material for a semiconductor device. Specifically, for example in a case where Si is adopted as a material for a semiconductor device, in forming an electrode, for example, Al (aluminum) is used and heat treatment at a relatively low temperature is performed. By doing so, Si and Al establish good ohmic contact with each other. If SiC is adopted as a material for a semiconductor device, however, it is more difficult to form ohmic contact than in the case where Si is adopted as a material for a semiconductor device described above.

Therefore, in adopting SiC as a material for a semiconductor device, for example, a joint method in which, while Ni (nickel) and SiC are brought in contact with each other, they are subjected to heat treatment at a relatively high temperature (for example, approximately 1000° C.) has conventionally been used. Namely, by performing heat treatment as described above, Ni and Si atoms in SiC are alloyed. As a result of this alloying, Ni and SiC establish good ohmic contact. Thus, it has been known that contact resistance can be lowered by adopting Ni (nickel) as a material for an electrode in contact with an n-type SiC region containing an n-type impurity (an impurity having an n conductivity type) and adopting Ti (titanium)/Al (aluminum) as a material for an electrode in contact with a p-type SiC region containing a p-type impurity (an impurity having a p conductivity type) (see, for example, Satoshi TANIMOTO et al., "Practical Device-Directed Ohmic Contacts on 4H—SiC," IEICE Transactions C, the Institute of Electronics, Information and Communication Engineers, April 2003, Vol. J86-C, No. 4, pp. 359-367 (Non-Patent Document 1)).

PRIOR ART DOCUMENTS

Non-Patent Documents

Non-Patent Document 1: Satoshi TANIMOTO et al., "Practical Device-Directed Ohmic Contacts on 4H—SiC," IEICE Transactions C, the Institute of Electronics, Information and Communication Engineers, April 2003, Vol. J86-C, No. 4, pp. 359-367

SUMMARY OF THE INVENTION

Problems to be Solved by the Invention

As described above, by appropriately selecting a material for forming an electrode in accordance with whether a region in contact with an electrode is an n-type SiC region or a p-type SiC region, contact resistance between an n-type region, a p-type region and an electrode can be lowered even when SiC is adopted as a material for a semiconductor device. If a material for forming an electrode in contact with the n-type region is different from a material for forming an electrode in contact with the p-type region, however, a plurality of steps for forming these electrodes are required, which leads to increase in the number of steps in a manufacturing process. Consequently, a problem of increase in manufacturing cost of a semiconductor device arises. In addition, difference between a material for forming an electrode in contact with the m-type region and a material for forming an electrode in contact with the p-type region may prevent improvement in integration of a semiconductor device.

Then, as means for solving the problems described above, it has recently been studied to use an ohmic contact electrode containing Ti, Al and Si (that is, Ti, Al and Si being alloyed) as a material for forming an electrode. An ohmic contact electrode in which Ti, Al and Si are alloyed can be in contact with any of an n-type SiC region and a p-type SiC region, with contact resistance being sufficiently suppressed.

FIG. 47 is a schematic cross-sectional view showing one example of a structure of a conventionally used vertical SiC-MOSFET. As shown in FIG. 47, a conventional MOSFET 1000 includes an n$^+$ SiC substrate 11 which is a substrate composed, for example, of silicon carbide (SiC) and having an n conductivity type (a first conductivity type), an n$^-$ SiC layer 12 serving as a semiconductor layer composed of SiC and having the n conductivity type (the first conductivity type), a pair of p bodies 13 serving as a second conductivity type region having a p conductivity type (a second conductivity type), an n$^+$ source region 14 serving as a high-concentration first conductivity type region having the n conductivity type (the first conductivity type), and a p$^+$ region 18 serving as a high-concentration second conductivity type region having the p conductivity type (the second conductivity type). Referring further to FIG. 47, MOSFET 1000 includes a gate oxide film 15 serving as a gate insulating film, a gate electrode 17, a drain electrode 55, and a pair of source contact electrodes 16.

Referring further to FIG. 47, a source internal interconnection 27 is arranged so as to connect one source contact electrode 16 of the pair of source contact electrodes 16 to the other source contact electrode 16 arranged at a position adjacent thereto. Then, an interlayer insulating film 21 is arranged so as to cover an outer peripheral portion of gate electrode 17 and to bury a gap between gate electrode 17 and source internal interconnection 27. Here, interlayer insulating film 21 has a function to electrically isolate, for example, source internal interconnection 27, source contact electrode 16 and gate electrode 17 in FIG. 47 from the outside and to protect MOSFET 1000. This interlayer insulating film 21 is composed, for example, of $SiO_2$ (silicon oxide). With such a construction, a current that flows from source contact electrode 16 to drain electrode 55 is controlled by controlling an electric signal input to source internal interconnection 27 or source contact electrode 16 and gate electrode 17.

Here, source contact electrode 16 is arranged to be in contact with both of $n^+$ source region 14 and $p^+$ region 18. By using the alloy containing Ti, Al and Si for source contact electrode 16, source contact electrode 16 establishes good ohmic contact with both of $n^+$ source region 14 and $p^+$ region 18.

In order to establish good ohmic contact of source contact electrode 16 described above with both of $n^+$ source region 14 and $p^+$ region 18, however, heat treatment at a high temperature around 1000° C. should be performed while both of them are joined to each other. By doing so, Ti, Al and Si forming source contact electrode 16 can be alloyed so that source contact electrode 16 can establish good ohmic contact with $n^+$ source region 14 and the like.

Here, in MOSFET 1000 in FIG. 47, source contact electrode 16 in which Al has been alloyed and gate oxide film 15 composed, for example, of $SiO_2$ are connected to each other. In addition, source contact electrode 16 and interlayer insulating film 21 composed, for example, of $SiO_2$ are arranged at locations extremely close to each other. In forming MOSFET 1000 having such a structure, if heat treatment at a high temperature around 1000° C. is performed in order to alloy source contact electrode 16, eutectic reaction between Al in source contact electrode 16 and $SiO_2$ occurs. In general, if heating to approximately 500° C. or higher is performed while alloyed Al and $SiO_2$ are joined to each other, reduction action by the alloyed Al is exerted on $SiO_2$ and thus $SiO_2$ is reduced to Si. Therefore, a member including $SiO_2$ as an insulator, such as gate oxide film 15 or interlayer insulating film 21, is subjected to reduction to Si as a result of action by Al in source contact electrode 16. Then, electric characteristics such as insulating property or capacity stability of gate oxide film 15 or interlayer insulating film 21 may deteriorate.

The present invention was made in view of the problems above, and an object of the present invention is to provide a semiconductor device having a construction capable of achieving suppressed deterioration of electric characteristics in an insulating member.

Means for Solving the Problems

A semiconductor device according to the present invention includes: an SiC layer; an ohmic electrode formed on a main surface of the SiC layer; another electrode arranged at a distance from the ohmic electrode on the main surface of the SiC layer; and an insulating layer located between the ohmic electrode and another electrode. A rate of lowering in electric resistance in the insulating film is not higher than 5% when heating to a temperature not higher than 1200° C. is carried out while the ohmic electrode and the insulating layer are adjacent to each other. From a different point of view, the ohmic electrode and the insulating layer do not react to each other in heating to a temperature not higher than 1200° C.

Here, the ohmic electrode is represented, for example, by source contact electrode 16 in FIG. 47 in which Al is alloyed. In addition, another electrode herein is represented, for example, by gate electrode 17 in FIG. 47. The insulating layer located between source contact electrode 16 and gate electrode 17 in FIG. 47 is interlayer insulating film 21 or gate oxide film 15. The semiconductor device according to the present invention also includes a construction the same as that of MOSFET 1000 shown in FIG. 47. It is noted that the semiconductor device according to the present invention is constructed such that the ohmic electrode corresponding to source contact electrode 16 in FIG. 47 and the insulating layer corresponding to interlayer insulating film 21 or gate oxide film 15 in FIG. 47 do not react to each other by heating at the time of formation.

Specifically, for example, the ohmic electrode is made of an alloy containing Al, and in forming (alloying) the ohmic electrode, the step of heating to a temperature not higher than 1200° C. (around 1000° C.) is carried out. On the other hand, for example, the insulating layer does not contain $SiO_2$ (the insulating layer is formed of a material other than $SiO_2$). Therefore, reduction reaction between Al alloyed in forming (alloying) the ohmic electrode and $SiO_2$ does not occur. Therefore, if the step of forming (alloying) the ohmic electrode is performed by heating to a temperature not higher than 1200° C., there is no change in composition of the insulating layer before and after the step. No change in composition of the insulating layer herein means that a rate of lowering in electric resistance of the insulating layer before and after the alloying step for forming the ohmic electrode is not higher than 5%. In addition, the rate of lowering is desirably not higher than 1%. Namely, deterioration of electric characteristics such as insulating property or capacity stability of gate oxide film 15 or interlayer insulating film 21 in FIG. 47 can be suppressed.

If the rate of lowering in electric resistance above exceeds 5% (that is, insulating property deteriorates by more than 5%), lowering in charge-to-breakdown $Q_{bd}$ ($C/cm^2$) mainly serving as an indicator of long-term reliability of gate oxide film 15 is unignorable. It is noted that the rate of lowering in electric resistance of the insulating layer before and after the alloying step herein refers to a ratio of variation in electric resistance of the insulating layer between before and after the alloying step above to electric resistance of the insulating layer before the alloying step above (an absolute value of variation in an electric resistance value decreased in the alloying step). More specifically, denoting an electric resistance value of the insulating layer before the alloying step as a and an electric resistance value of the insulating layer after the alloying step as b, the rate of lowering in electric resistance of the insulating layer can be calculated in the equation (a−b)/a.

In the semiconductor device according to the present invention, preferably, the insulating layer is an interlayer insulating film for electrically isolating the ohmic electrode and another electrode from each other, and at least a surface of the interlayer insulating film opposed to the ohmic electrode is composed of silicon nitride or silicon oxynitride.

If at least the surface of the interlayer insulating film, which is the insulating layer, opposed to the ohmic electrode is composed of silicon nitride ($Si_xN_y$) or silicon oxynitride ($SiO_xN_y$), in the alloying (heating) step for forming the ohmic electrode, reduction reaction between Al in the alloy forming the ohmic electrode and the interlayer insulating film does not occur. Therefore, in the heating step for forming the ohmic electrode, deterioration of electric characteristics such as insulating property or capacity stability of the interlayer insulating film can be suppressed.

If the surface of the interlayer insulating film opposed to the ohmic electrode is composed of $SiO_xN_y$, the interlayer insulating film will slightly contain $SiO_2$. Namely, reduction reaction between Al in the alloy forming the ohmic electrode and $SiO_2$ in the interlayer insulating film may occur. As compared with a case where the interlayer insulating film is composed of pure $SiO_2$, however, a ratio of $SiO_2$ contained in the interlayer insulating film is low. Therefore, even in a case where the surface of the interlayer insulating film opposed to the ohmic electrode is composed of $SiO_xN_y$, deterioration of electric characteristics such as insulating property or capacity stability of the interlayer insulating film can be suppressed as compared with a case where the surface is composed of $SiO_2$.

In addition, a semiconductor device according to the present invention includes: an SiC layer; an ohmic electrode formed on a main surface of the SiC layer; another electrode arranged at a distance from the ohmic electrode on the main surface of the SiC layer; and an insulating layer located between the ohmic electrode and another electrode. The insulating layer includes an interlayer insulating film for electrically isolating the ohmic electrode and another electrode from each other and a barrier layer arranged to cover an outer periphery of the interlayer insulating film. In addition, preferably, the barrier layer is formed of tungsten, tantalum, or oxide or carbide thereof.

In the semiconductor device according to the present invention, the barrier layer arranged to cover the outer periphery of the interlayer insulating film is arranged between the interlayer insulating film and the ohmic electrode or the source internal interconnection. Therefore, owing to presence of the barrier layer formed of tungsten (W), tantalum (Ta), or oxide or carbide thereof, the interlayer insulating film and the ohmic electrode are disconnected from each other. Therefore, arrangement of a barrier layer prevents reduction reaction between Al in the alloy forming the ohmic electrode and $SiO_2$ in the interlayer insulating film in the alloying (heating) step for forming the ohmic electrode even though the interlayer insulating film is composed of $SiO_2$. In addition, the barrier layer formed, for example, of W or Ta can have a function to improve adhesion between the source internal interconnection and the interlayer insulating film or can play a role as an underlying layer for stopping etching in forming the source internal interconnection in a desired pattern in mounting of the MOSFET. It is noted that any material other than tungsten, tantalum, or oxide or carbide thereof described above can be used so long as reaction between the interlayer insulating film and the ohmic electrode can be prevented in heating to a temperature not higher than 1200° C.

The semiconductor device according to the present invention described above further includes an extremely thin insulating film having a thickness not smaller than 30 nm and not greater than 100 nm between the SiC layer and another electrode, and preferably, a gap is arranged between the extremely thin insulating film, the insulating layer and the ohmic electrode.

The extremely thin insulating film is represented, for example, by gate oxide film 15 in FIG. 47 described above. If gate oxide film 15 is composed of $SiO_2$, arrangement of the gate oxide film in contact with the ohmic electrode leads to reduction reaction between Al in the alloy forming the ohmic electrode and $SiO_2$ in the interlayer insulating film in the alloying (heating) step for forming the ohmic electrode. Namely, electric characteristics such as insulating property of the gate oxide film may deteriorate. By providing a gap between the extremely thin insulating film, the insulating layer and the ohmic contact so as to avoid direct contact therebetween, however, occurrence of the reduction reaction as described above can be suppressed. Namely, deterioration of electric characteristics such as insulating property or capacity stability of the gate insulating film and the insulating layer can be suppressed.

Effects of the Invention

The semiconductor device according to the present invention can achieve suppressed deterioration of electric characteristics in an insulating member.

MODES FOR CARRYING OUT THE INVENTION

Figure 1:
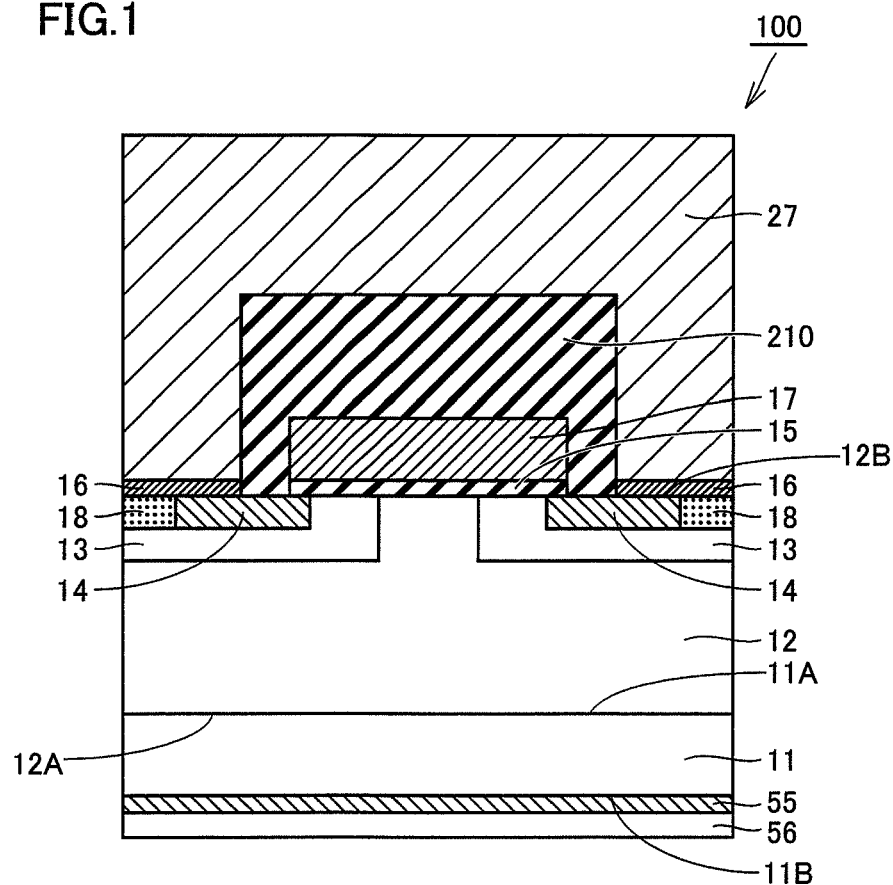
FIG. 1 is a schematic cross-sectional view showing a construction of a MOSFET representing a semiconductor device in a first embodiment.

An embodiment of the present invention will be described hereinafter with reference to the drawings. In the drawings below, the same or corresponding elements have the same reference characters allotted and description thereof will not be repeated.

(First Embodiment)

Initially, a MOSFET in the first embodiment will be described. Referring to FIG. 1, a MOSFET 100 in the first embodiment includes $n^+$ SiC substrate 11 being a substrate composed of silicon carbide (SiC) and having an n conductivity type (a first conductivity type), $n^-$ SiC layer 12 serving as a semiconductor layer composed of SiC and having the n conductivity type (the first conductivity type), a pair of p bodies 13 serving as second-conductivity-type regions having a p conductivity type (a second conductivity type), $n^+$ source region 14 serving as a high-concentration first-conductivity-type region having the n conductivity type (the first conductivity type), and $p^+$ region 18 serving as a high-concentration second-conductivity-type region having the p conductivity type (the second conductivity type). $N^+$ SiC substrate 11 contains an n-type impurity (an impurity having the n conductivity type) such as N (nitrogen) at high concentration.

$N^-$ SiC layer 12 is formed on one main surface 11A of $n^+$ SiC substrate 11, for example, to a thickness of approximately 10 μm, and it has the n conductivity type by containing an n-type impurity. Examples of n-type impurities contained in $n^-$ SiC layer 12 include N (nitrogen) and P (phosphorus), and an impurity is contained at concentration lower than concentration of an n-type impurity contained in $n^+$ SiC substrate 11, for example, at concentration of $1\times10^{16}$ cm$^{-3}$. It is noted that the main surface herein refers to a major surface having a largest area of the surfaces.

A pair of p bodies 13 is formed such that the p bodies are separate from each other so as to include a second main surface 12B of $n^-$ SiC layer 12, which is a main surface opposite to a first main surface 12A which is a main surface on the $n^+$ SiC substrate 11 side, and the pair has the p conductivity type (the second conductivity type) by containing a p-type impurity (an impurity having the p conductivity type). For example, Al, B (boron) or the like is adopted as a p-type impurity to be contained in p body 13, and it is contained at concentration lower than concentration of the n-type impurity contained in $n^+$ SiC substrate 11, for example, at concentration from $1\times10^{16}$ cm$^{-3}$ to $5\times10^{18}$ cm$^{-3}$.

$N^+$ source region 14 is formed within each p body 13 so as to include second main surface 12B and to be surrounded by p body 13. N⁺ source region 14 contains an n-type impurity such as P (phosphorus) at concentration higher than concentration of the n-type impurity contained in n⁻ SiC layer 12, for example, at concentration of $1 \times 10^{20}$ cm$^{-3}$.

P⁺ region 18 is formed to include second main surface 12B, on the side opposite to n⁺ source region 14 formed within the other p body 13, when viewed from n⁺ source region 14 formed within one p body 13 of the pair of p bodies 13. P⁺ region 18 contains a p-type impurity such as Al or B at concentration higher than concentration of the p-type impurity contained in p body 13, for example, at concentration of $1 \times 10^{20}$ cm$^{-3}$.

Referring further to FIG. 1, MOSFET 100 includes gate oxide film 15 serving as a gate insulating film (an extremely thin insulating film), gate electrode 17, a pair of source contact electrodes 16, source internal interconnection 27, drain electrode 55, and an interlayer insulating film 210.

Gate oxide film 15 is formed on second main surface 12B of n⁻ SiC layer 12 so as to be in contact with second main surface 12B and to extend from an upper surface of one n⁺ source region 14 to an upper surface of the other source region 14, and it is composed, for example, of silicon dioxide (SiO₂).

Gate electrode 17 is arranged in contact with gate oxide film 15 so as to extend from one n⁺ source region 14 to the other n⁺ source region 14 over the same. In addition, gate electrode 17 is made of a conductor such as polysilicon.

Source contact electrode 16 is arranged in contact with second main surface 12B, so as to extend from a pair of n⁺ source regions 14, in a direction away from gate oxide film 15, to p⁺ region 18. In addition, source contact electrode 16 is made of an alloy containing Ti, Al and Si. More specifically, source contact electrode 16 is made of an alloy containing Ti, Al, Si, and C (carbon) as well as a remaining impurity such as O (oxygen). Being composed of the materials described above, source contact electrode 16 serves as an ohmic contact electrode establishing good ohmic contact with n⁻ SiC layer 12, n⁺ source region 14, or p⁺ region 18. In addition, source contact electrode 16 is arranged to extend in contact with both of n⁺ source region 14 and p⁺ region 18. Since an electrode for establishing ohmic contact with n⁺ source region 14 and an electrode for establishing ohmic contact with p⁺ region 18 are integrated with each other, only a single electrode, instead of two electrodes that had to be formed previously, for establishing ohmic contact should be formed in forming MOSFET 100. Therefore, MOSFET 100 in the present embodiment is a semiconductor device capable of achieving decrease in the number of steps in a manufacturing process and improvement in integration.

Source internal interconnection 27 is arranged to connect one source contact electrode 16 of the pair of source contact electrodes 16 to the other source contact electrode 16 arranged at a position adjacent thereto. This source internal interconnection 27 is formed as a metal interconnection composed, for example, of Al.

Drain electrode 55 is formed in contact with the other main surface 11B of n⁺ SiC substrate 11, which is a main surface opposite to one main surface 11A which is a main surface on a side where n⁻ SiC layer 12 is formed. For example, this drain electrode 55 may be made of a material containing Ti, Al and Si, as in source contact electrode 16 above, or it may be made of another material capable of establishing ohmic contact with n⁺ SiC substrate 11, such as Ni or NiSi. Thus, drain electrode 55 is electrically connected to n⁺ SiC substrate 11.

In addition, a drain contact electrode 56 is formed on a main surface of drain electrode 55 opposite to n⁺ SiC substrate 11 (under drain electrode 55 in FIG. 1). Drain contact electrode 56 is a thin film electrode composed, for example, of Al or Au.

Interlayer insulating film 210 has a function to electrically isolate source internal interconnection 27 and gate electrode 17 arranged, for example, to connect one source contact electrode 16 to the other source contact electrode 16 in FIG. 1 from the outside as well as to protect MOSFET 100. This interlayer insulating film 210 is composed, for example, of $Si_xN_y$ (silicon nitride).

Interlayer insulating film 210 is arranged to cover an outer peripheral portion of gate electrode 17 and to bury a gap between gate electrode 17 and source internal interconnection 27. As shown in FIG. 1, interlayer insulating film 210 is in contact with the outer peripheral portion of gate electrode 17 and with an inner peripheral portion of source internal interconnection 27. In addition, interlayer insulating film 210 in FIG. 1 is also arranged in a region lying between source contact electrode 16 and gate oxide film 15, in a direction in which the main surface of source contact electrode 16 extends (a lateral direction in FIG. 1). According to such a construction, for example, interlayer insulating film 210 can suppress flow of a current from source internal interconnection 27 to gate electrode 17.

Figure 47:
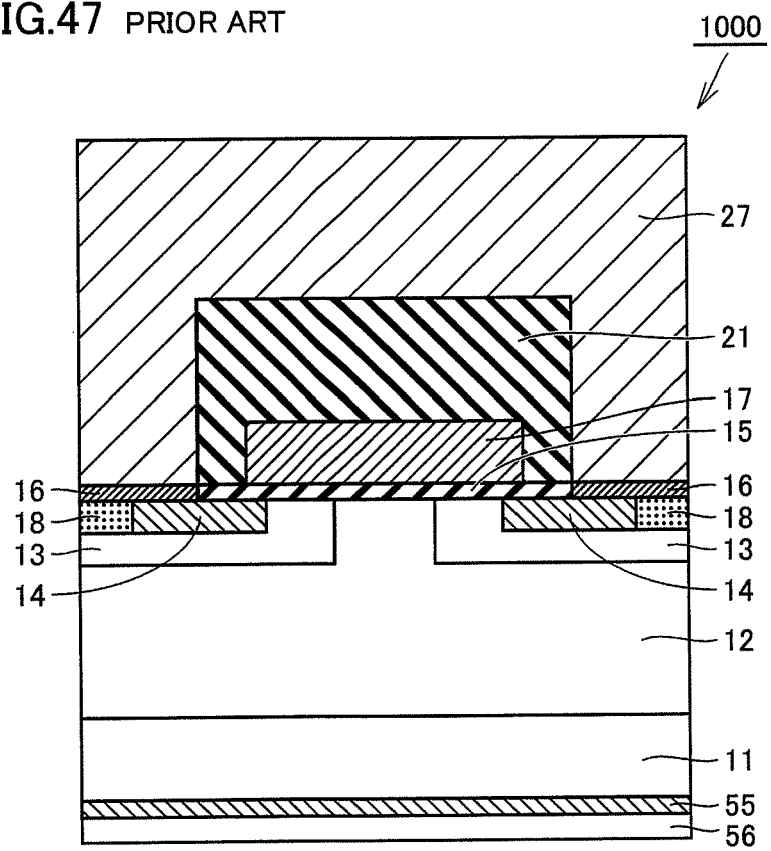
FIG. 47 is a schematic cross-sectional view showing a structure of a conventionally used vertical SiC-MOSFET.

Here, since $Si_xN_y$ is used for interlayer insulating film 210, no oxygen atom (O) is contained in interlayer insulating film 210. Therefore, reaction of Al in source contact electrode 16 to oxygen atoms in gate oxide film 15 or interlayer insulating film 21 due to heating of source contact electrode 16 to a temperature around 1000° C. for alloying, for example as in MOSFET 1000 in FIG. 47 described above, can be suppressed. Specifically, for example, the construction is such that interlayer insulating film 210 composed of $Si_xN_y$ lies between source contact electrode 16 and gate oxide film 15. Therefore, even if heat treatment (alloying treatment) is performed at a temperature not higher than 1200° C. (around 1000° C.) in order to bring a metal material forming source contact electrode 16 in good contact with n⁺ source region 14 and p⁺ region 18 to be in contact therewith, reduction reaction of interlayer insulating film 210 to a metal material forming source contact electrode 16 does not occur. This is because source contact electrode 16 is not in contact with a member containing oxygen atoms. Gate oxide film 15 composed of SiO₂ containing oxygen atoms is discontinuous to source contact electrode 16 because interlayer insulating film 210 composed of $Si_xN_y$ is interposed. Thus, reaction of Al in source contact electrode 16 to gate oxide film 15 in the heat treatment above is suppressed.

Therefore, by providing interlayer insulating film 210 composed of $Si_xN_y$, reaction of gate oxide film 15 to Al in heating of source contact electrode 16 to a temperature not higher than 1200° C. for alloying can be suppressed. Namely, deterioration in electric characteristics such as insulating property or capacity stability due to reaction of gate oxide film 15 can be suppressed. Thus, a stable and high-quality semiconductor device can be provided.

It is noted that interlayer insulating film 210 or source internal interconnection 27 in FIG. 1 has a vertical thickness in particular at left and right end portions significantly greater than in a central portion. In addition, a corner portion of interlayer insulating film 210 or source internal interconnection 27 is angulated. It is noted, however, that this is done so for facilitated understanding of the drawings and a thickness of interlayer insulating film 210 or the source internal interconnection is actually substantially uniform across a lateral direction in the cross-sectional view in FIG. 1. In addition, a corner portion of interlayer insulating film 210 or source internal interconnection 27 is rounded, which is also similar in each figure below.

Further, a semiconductor device is constructed such that MOSFETs 100 shown in FIG. 1 are arranged in a direction in which the main surface of n+ SiC substrate 11 or n− SiC layer 12 extends. FIG. 1 shows only a single MOSFET 100 which is a minimal constituent unit. Therefore, the left end and the right end of FIG. 1 are not shown, however, actually, MOSFETs 100 in FIG. 1 are provided in four directions, which is also similar in each figure below.

An operation of MOSFET 100 will now be described. Referring to FIG. 1, in such a state that a voltage not higher than a threshold value is applied to gate electrode 17, that is, in an OFF state, a portion between p body 13 located directly under gate oxide film 15 and n− SiC layer 12 is reverse-biased and in a non-conducting state. On the other hand, as a positively increasing voltage is applied to gate electrode 17, an inversion layer is formed in a channel region, which is a region around a portion of contact of p body 13 with gate oxide film 15. Consequently, n+ source region 14 and n− SiC layer 12 are electrically connected to each other and a current flows between source contact electrode 16 (or source internal interconnection 27) and drain electrode 55.

Figure 2:
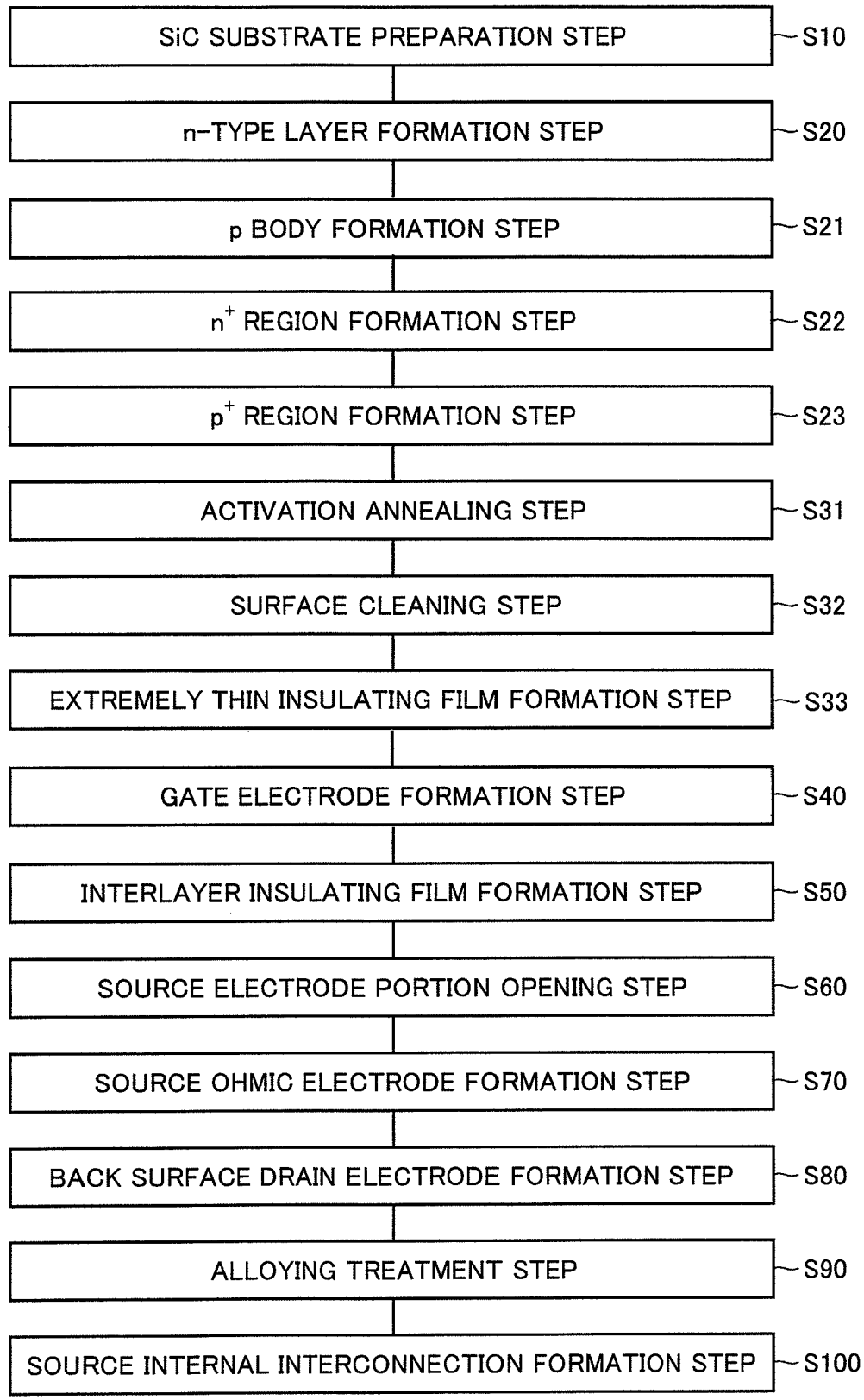
FIG. 2 is a flowchart showing outlines of a method of manufacturing a MOSFET in the first embodiment.
Figure 3:
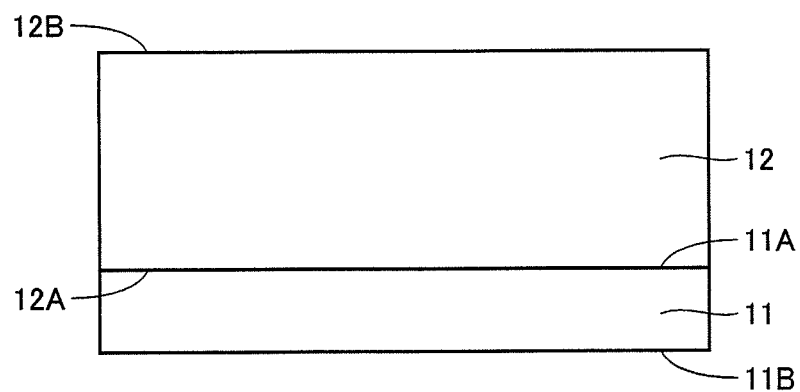
FIG. 3 is a schematic cross-sectional view for illustrating a method of manufacturing a MOSFET in the first embodiment.

A method of manufacturing a MOSFET representing a semiconductor device in the first embodiment representing one embodiment of a method of manufacturing a semiconductor device according to the present invention will now be described. Referring to FIG. 2, in the method of manufacturing a MOSFET in the first embodiment, initially, an SiC substrate preparation step (S10) is performed. In this step (S10), an SiC substrate of the first conductivity type is prepared. Specifically, referring to FIG. 3, for example, n+ SiC substrate 11 composed of hexagonal SiC and having the n conductivity type by containing an n-type impurity is prepared.

Referring next to FIG. 2, an n-type layer formation step (S20) is performed. In this step (S20), a semiconductor layer of the first conductivity type is formed on n+ SiC substrate 11. Specifically, referring to FIG. 3, n− SiC layer 12 is formed on one main surface 11A of n+ SiC substrate 11 through epitaxial growth. Epitaxial growth can be achieved, for example, with CVD using a gas mixture of $SiH_4$ (silane) and $C_3H_8$ (propane) as a source gas and using an $H_2$ (hydrogen) gas as a carrier gas. Here, for example, N or P is preferably introduced as the n-type impurity. Thus, n− SiC layer 12 containing an n-type impurity at concentration lower than concentration of an n-type impurity contained in n+ SiC substrate 11 can be formed. Specifically, the concentration of the n-type impurity in n− SiC layer 12 is, for example, preferably not lower than $5 \times 10^{15}$ cm$^{-3}$ and not higher than $5 \times 10^{16}$ cm$^{-3}$.

Referring next to FIG. 2, a p body formation step (S21) is performed. In this step (S21), referring to FIG. 4, a second-conductivity-type region having the second conductivity type is formed so as to include second main surface 12B of n− SiC layer 12, which is the main surface opposite to first main surface 12A which is the main surface on the n+ SiC substrate 11 side. Specifically, initially, an oxide film composed of $SiO_2$ is formed on second main surface 12B, for example, with CVD (Chemical Vapor Deposition). Then, after a resist is applied onto the oxide film, exposure and development are performed to thereby form a resist film having an opening in a region in conformity with a desired shape of p body 13 serving as the second-conductivity-type region. Using this resist film as a mask, the oxide film is partially removed, for example, through RIE (Reactive Ion Etching), and a mask layer formed of the oxide film having an opening pattern is formed on n− SiC layer 12. Thereafter, the resist film above is removed. Then, using this mask layer as a mask, ion implantation of a p-type impurity such as Al in n− SiC layer 12 is performed, to thereby form p body 13 in n− SiC layer 12. It is noted that a mask composed, for example, of $SiO_2$ is preferably used for exposure and development of the resist described above.

Referring next to FIG. 2, an n+ region formation step (S22) is performed. In this step (S22), a high-concentration first-conductivity-type region containing an impurity having the first conductivity type at concentration higher than in n− SiC layer 12 is formed in a region within p body 13 including second main surface 12B. Specifically, referring to FIG. 4, initially, after the oxide film above used as the mask in the step (S21) is removed, a mask layer having an opening in a region in conformity with a desired shape of n+ source region 14 is formed in accordance with a procedure similar to the step (S21). Then, using this mask layer as a mask, an n-type impurity such as P is introduced in n− SiC layer 12 through ion implantation, to thereby form n+ source region 14.

Referring next to FIG. 2, a p+ region formation step (S23) is performed. In this step (S23), referring to FIG. 4, a high-concentration second-conductivity-type region (p+ region 18) is formed to include second main surface 12B on the side opposite to n+ source region 14 formed within the other p body 13, when viewed from n+ source region 14 formed within one p body 13 of the pair of p bodies 13. Specifically, referring to FIG. 4, a mask layer having an opening in a region in conformity with a desired shape of p+ region 18 is formed in accordance with a procedure similar to the steps (S21) and (S22), and using this mask layer as a mask, a p-type impurity such as Al or B is introduced in n− SiC layer 12 through ion implantation, to thereby form p+ region 18.

Referring next to FIG. 2, an activation annealing step (S31) is performed. In this step (S31), activation annealing which is heat treatment for activating an impurity introduced through ion implantation above and recovering crystallinity is performed by heating n− SiC layer 12 in which ions have been implanted to a temperature not lower than 1700° C. and not higher than 1800° C., for example, in an Ar (argon) atmosphere and holding the layer for approximately 30 minutes.

Referring next to FIG. 2, a surface cleaning step (S32) is performed. In this step (S32), as shown in FIG. 4, second main surface 12B of n− SiC layer 12 where p body 13, n+ source region 14 and p+ region 18 are formed and the other main surface 11B of n+ SiC substrate 11 are cleaned.

Figure 4:
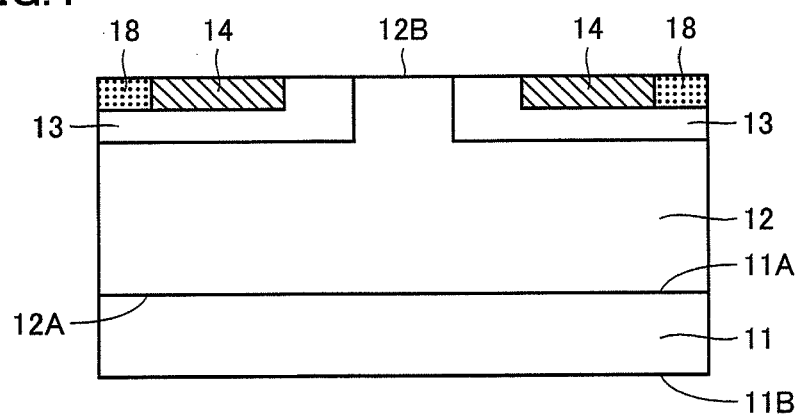
FIG. 4 is a schematic cross-sectional view for illustrating the method of manufacturing a MOSFET in the first embodiment.

Specifically, for example, a thermal oxide film is formed on second main surface 12B and the other main surface 11B shown in FIG. 4, for example, by performing heat treatment in which a heating temperature is not lower than 1100° C. and not higher than 1300° C. in a dry oxygen atmosphere and a holding time is set around 10 minutes. Thereafter, the thermal oxide film above is removed by using buffered hydrofluoric acid, to thereby clean second main surface 12B and the other main surface 11B. Thereafter, surface cleaning is preferably performed by performing organic cleaning using an organic solvent, acid cleaning using acid, or RCA cleaning.

Figure 5:
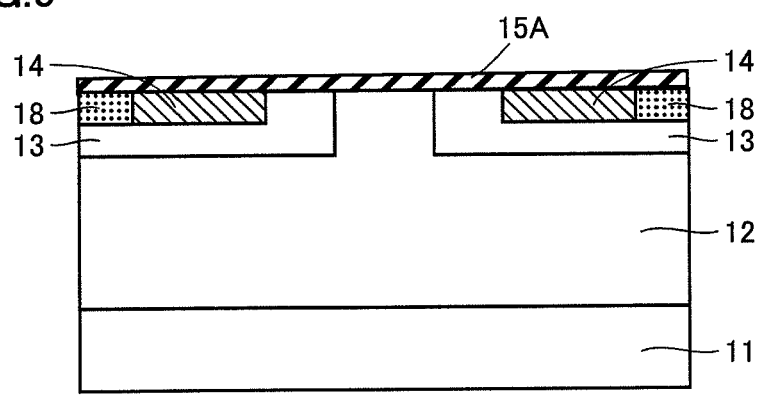
FIG. 5 is a schematic cross-sectional view for illustrating the method of manufacturing a MOSFET in the first embodiment.

Referring next to FIG. 2, an extremely thin insulating film formation step (S33) is performed. In this step (S33), referring to FIG. 5, n+ SiC substrate 11 on which n− SiC layer 12 including a desired ion implantation region has been formed through the steps (S10) to (S32) is subjected to thermal oxidation. Specifically, thermal oxidation can be performed, for example, by heating n+ SiC substrate 11 to a temperature not lower than 1100° C. and not higher than 1300° C. in a dry oxygen atmosphere and holding the substrate for approximately 30 minutes to 60 minutes. Thus, an extremely thin insulating film 15A to serve as gate oxide film 15 (see FIG. 1) which is a thermal oxide film of silicon dioxide ($SiO_2$) (for example, having a thickness approximately from 30 nm to 100 nm) is formed on second main surface 12B. Though a thickness of extremely thin insulating film 15A corresponds to a dielectric constant of extremely thin insulating film 15A, a range from a gate voltage operation range including spike in an insulating gate transistor to the range described above is generally appropriate.

In the extremely thin insulating film formation step (S33), dry oxidation performed in an oxygen atmosphere may be employed as described above, however, for example, wet oxidation in which heating is performed in an oxygen atmosphere containing vapor or pyrogenic oxidation in which hydrogen atoms in vapor generated in oxidation of SiC terminate with hydrogen, dangling bonds (unattached bonds of atom) at an interface more effectively than in dry oxidation may be employed. In addition, extremely thin insulating film 15A formed in the step (S33) may be subjected to annealing as in the step (S31) described above, as additional treatment. In this annealing, for example, heating at a temperature not lower than 1100° C. and not higher than 1300° C. for approximately 30 minutes to 90 minutes in an NO (nitric oxide) atmosphere or in an $N_2O$ (nitrous oxide) atmosphere and successive heating at a temperature not lower than 1100° C. and not higher than 1300° C. for approximately 30 minutes to 90 minutes in an Ar atmosphere is preferably performed.

Referring next to FIG. 2, a gate electrode formation step (S40) is performed. In this step (S40), referring to FIG. 6, for example, gate electrode 17 (see FIG. 1) composed, for example, of polysilicon which is a conductor is formed in contact with gate oxide film 15, so as to extend from one $n^+$ source region 14 to the other $n^+$ source region 14. If polysilicon is adopted as a raw material for the gate electrode, polysilicon can contain P or B at high concentration around $1 \times 10^{20}$ $cm^{-3}$. It is noted that gate electrode 17 preferably has a thickness approximately from 300 to 500 nm.

Figure 6:
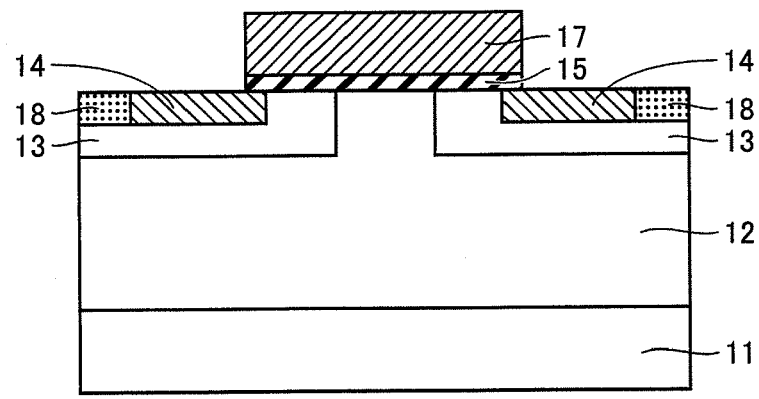
FIG. 6 is a schematic cross-sectional view for illustrating the method of manufacturing a MOSFET in the first embodiment.

In order to form gate electrode 17 so as to extend from one $n^+$ source region 14 to the other $n^+$ source region 14, a photolithography technique is preferably used. Specifically, initially, after a resist is applied onto gate electrode 17 formed in contact with substantially the entire surface of extremely thin insulating film 15A shown in FIG. 5, exposure and development are performed to form a resist film in a region in conformity with a desired shape of gate electrode 17. Then, using the resist film as a mask, gate electrode 17 and extremely thin insulating film 15A are partially removed, for example, through RIE (Reactive Ion Etching). Gate electrode 17 and gate oxide film 15 are thus formed as shown in FIG. 6. The region from which gate electrode 17 and extremely thin insulating film 15A were partially removed is in such a state that the respective main surfaces of $n^+$ source region 14 and $n^+$ region 18 are exposed as shown in FIG. 6.

Figure 7:
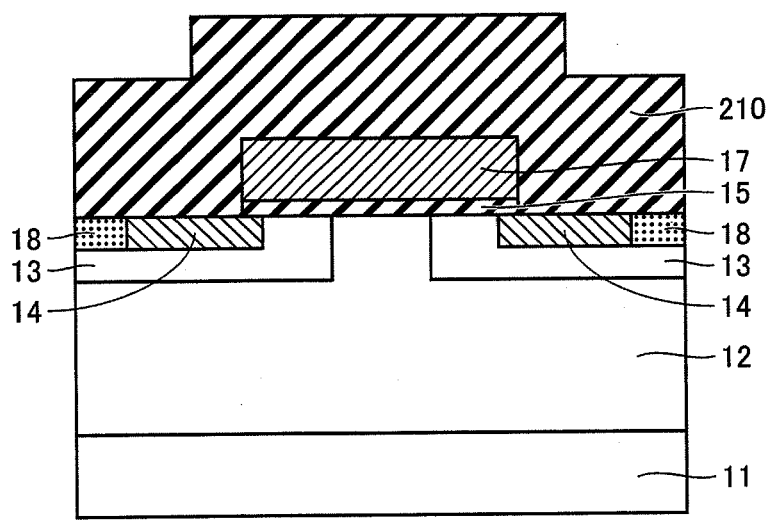
FIG. 7 is a schematic cross-sectional view for illustrating the method of manufacturing a MOSFET in the first embodiment.

Referring next to FIG. 2, an interlayer insulating film formation step (S50) is performed. In this step (S50), referring to FIG. 7, interlayer insulating film 210 formed of a silicon nitride film ($Si_xN_y$) or a silicon oxynitride film ($SiO_xN_y$) is formed, for example, with CVD (Chemical Vapor Deposition). Here, interlayer insulating film 210 having a thickness not smaller than 0.5 μm and not greater than 1.5 μm and preferably not smaller than 0.7 μm and not greater than 1.3 μm, for example, 1.0 μm, is formed in particular by using plasma CVD. Interlayer insulating film 210 shown in FIG. 7 is thus formed in contact with the respective surfaces of $p^+$ region 18, $n^+$ source region 14 and gate electrode 17.

If a silicon oxynitride film ($SiO_xN_y$) containing oxygen is used for interlayer insulating film 210 instead of $Si_xN_y$, oxygen atoms are contained in interlayer insulating film 210. $SiO_xN_y$, however, is lower in a ratio of content of oxygen atoms, for example, than $SiO_2$ in interlayer insulating film 21 in FIG. 47. Therefore, even in a case where a silicon oxynitride film ($SiO_xN_y$) is used as interlayer insulating film 210, an effect of suppressing reaction between the interlayer insulating film and Al in the alloy for source contact electrode 16 (ohmic electrode) during heat treatment can be achieved as in the case of using $Si_xN_y$. It is noted that the similar effect is obtained also when interlayer insulating film 210 composed of any of fluorinated silicon oxide (SiOF) or silicon oxycarbide (SiOC) instead of $Si_xN_y$ or $SiO_xN_y$ described above is formed.

Referring next to FIG. 2, a source electrode portion opening step (S60) is performed. In this step (S60), a part of interlayer insulating film 210 formed in the step (S50) is removed. Namely, in the step (S60), interlayer insulating film 210 formed in a region where source contact electrode 16 is to be formed in a subsequent step is removed. Specifically, referring to FIG. 8, interlayer insulating film 210 in contact with each of $n^+$ source region 14 and $p^+$ region 18 formed within the pair of p bodies 13 is preferably removed. This is because source contact electrode 16 is formed to extend from $n^+$ source region 14 to $p^+$ region 18 arranged in contact therewith, in a manner in contact with these regions, as shown in FIG. 1.

Figure 8:
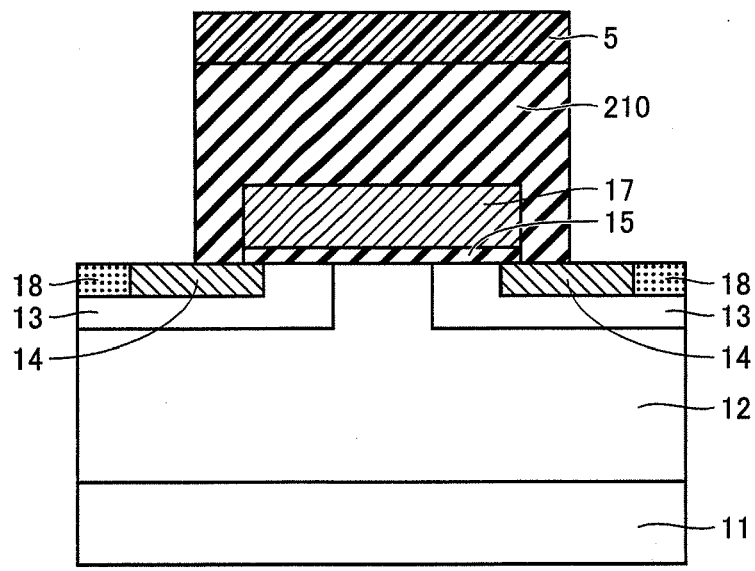
FIG. 8 is a schematic cross-sectional view for illustrating the method of manufacturing a MOSFET in the first embodiment.

The step (S60) is specifically performed in the following procedure. After a resist is applied onto interlayer insulating film 210 formed to be in contact with the respective surfaces of $p^+$ region 18, $n^+$ source region 14 and gate electrode 17 shown in FIG. 7, exposure and development are performed to thereby form a resist film having an opening in a region in conformity with a desired shape of interlayer insulating film 210. Then, using this resist film as a mask, interlayer insulating film 210 is partially removed, for example, through RIE (Reactive Ion Etching). An opening pattern of interlayer insulating film 210 is thus formed in a desired region. Referring to FIG. 8, a pattern of a mask layer 5 is formed in contact with remaining interlayer insulating film 210.

Figure 9:
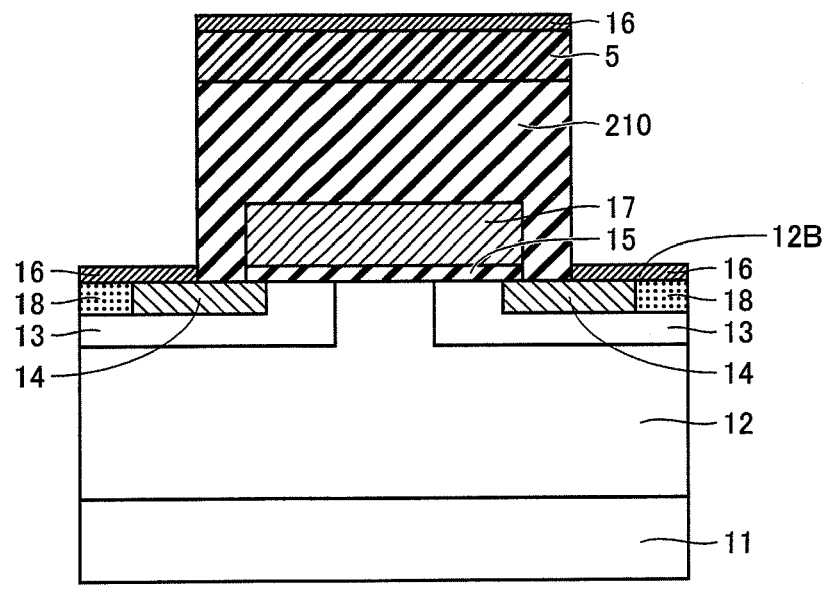
FIG. 9 is a schematic cross-sectional view for illustrating the method of manufacturing a MOSFET in the first embodiment.

Referring next to FIG. 2, a source ohmic electrode formation step (S70) is performed. In this step (S70), a Ti film composed of Ti, an Al film composed of Al, and an Si film composed of Si for forming a source ohmic electrode (source contact electrode 16 in FIG. 1) are formed in this order. Specifically, referring to FIG. 9, initially, the Ti film, the Al film and the Si film described above are formed, for example, with sputtering particularly on the main surface of $p^+$ region 18 and the main surface of $n^+$ source region 14, that are exposed in second main surface 12B, as well as on mask layer 5 formed to be in contact with interlayer insulating film 210. Thereafter, by removing mask layer 5, the Ti film, the Al film and the Si film described above on mask layer 5 are also removed. Thus, as shown in FIG. 9, only the Ti film, the Al film and the Si film on the main surface of $p^+$ region 18 and the main surface of $n^+$ source region 14 remains. Thus, as shown with source contact electrode 16 in FIG. 10, the Ti film, the Al film and the Si film are formed only on the main surface of $p^+$ region 18 and the main surface of $n^+$ source region 14. Lift-off is thus preferably performed to form a desired film on mask layer 5 formed in the step (S60) and to form a film only in a desired region by subsequently removing mask layer 5.

In FIG. 9, a stack structure constituted of the Ti film composed of Ti, the Al film composed of Al, and the Si film composed of Si for forming the source ohmic electrode is drawn as source contact electrode 16.

Referring next to FIG. 2, a back surface drain electrode formation step (S80) is performed. In this step (S80), an Ni layer or an NiSi layer serving as a back surface electrode pad is formed as drain electrode 55 on the main surface of n$^+$ SiC substrate 11 opposite to the side where n$^-$ SiC layer 12 is formed.

Figure 10:
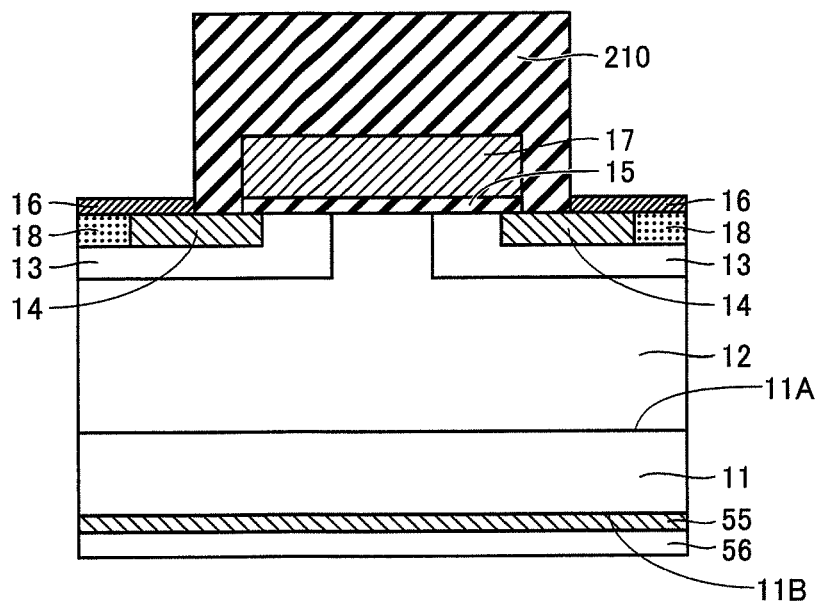
FIG. 10 is a schematic cross-sectional view for illustrating the method of manufacturing a MOSFET in the first embodiment.

Specifically, referring to FIG. 10, the Ni layer or the NiSi layer described above is vapor-deposited, for example, with sputtering on the other main surface 11B of n$^+$ SiC substrate 11, which is the main surface opposite to one main surface 11A which is the main surface where n$^-$ SiC layer 12 is formed, to thereby form the back surface electrode pad (drain electrode 55). Drain electrode 55 made of these materials establishes good ohmic contact with n$^+$ SiC substrate 11.

It is noted that the Ni layer has a thickness preferably not smaller than 30 nm and not greater than 200 nm and further preferably not smaller than 50 nm and not greater than 150 nm among others, for example, 100 nm. The NiSi layer has a thickness preferably not smaller than 30 nm and not greater than 200 nm and further preferably not smaller than 50 nm and not greater than 150 nm among others, for example, 100 nm.

In addition, after drain electrode 55 is formed, drain contact electrode 56 is preferably formed on a lower main surface of drain electrode 55 as shown in FIG. 10. Drain contact electrode 56 is preferably a thin film composed, for example, of Al or Au and having a thickness around 1 μm. Drain contact electrode 56 is preferably formed, for example, with vapor deposition by sputtering, as in the case of drain electrode 55.

By setting the thickness condition as above, drain electrode 55 above can serve as the ohmic drain electrode having low resistance in a stable manner. It is noted that any of the step (S70) and the step (S80) may be performed first.

Referring next to FIG. 2, an alloying treatment step (S90) is performed. Specifically, referring to FIG. 10, n$^+$ SiC substrate 11 for which the procedure above has been completed is heated to a temperature not lower than 550° C. and not higher than 1200° C., preferably not lower than 900° C. and not higher than 1100° C., for example 1000° C., in an atmosphere of an inert gas such as Ar and held for a time period not longer than 10 minutes, for example, 1 minute. Thus, Ti, Al and Si contained in the Ti film, the Al film and the Si film respectively as well as C contained in n$^-$ SiC layer 12 or n$^+$ SiC substrate 11 are alloyed. Consequently, as shown in FIG. 10, source contact electrode 16 arranged in contact with second main surface 12B, extending from the pair of n$^+$ source regions 14 in a direction away from gate oxide film 15 to p$^+$ region 18 is formed. In addition, drain electrode 55 arranged in contact with the other main surface 11B of n$^+$ SiC substrate 11, which is the main surface opposite to one main surface 11A which is the main surface on the side where n$^-$ SiC layer 12 is formed, is formed simultaneously through the heating above. Here, in the step (S90), n$^+$ SiC substrate 11 is preferably heated in a gas mixture of an inert gas, in particular, Ar and/or N$_2$, and hydrogen. Thus, source contact electrode 16, with its contact resistance with n$^+$ source region 14 and p body 13 (p$^+$ region 18) being further reliably lowered and manufacturing cost being suppressed, can be fabricated.

Even if n$^+$ SiC substrate 11 is exposed to a high temperature around 1000° C. in heat treatment for this alloying, in the present first embodiment, change in composition of interlayer insulating film 210 due to reaction between Al in source contact electrode 16 and interlayer insulating film 210 and change in composition of gate oxide film 15 due to reaction between Al and oxygen atoms in gate oxide film 15 are suppressed. This is because interlayer insulating film 210 composed of Si$_x$N$_y$ lower in reactivity with Al than SiO$_2$ lies between Al in source contact electrode 16 and oxygen atoms in gate oxide film 15 and thus interlayer insulating film 210 suppresses reaction between Al in source contact electrode 16 and oxygen atoms in gate oxide film 15.

Referring next to FIG. 2, a source internal interconnection formation step (S100) is performed. In this step (S100), source internal interconnection 27 which is a metal layer for electrically connecting one source contact electrode 16 and the other source contact electrode 16 in the pair to each other is formed.

Figure 11:
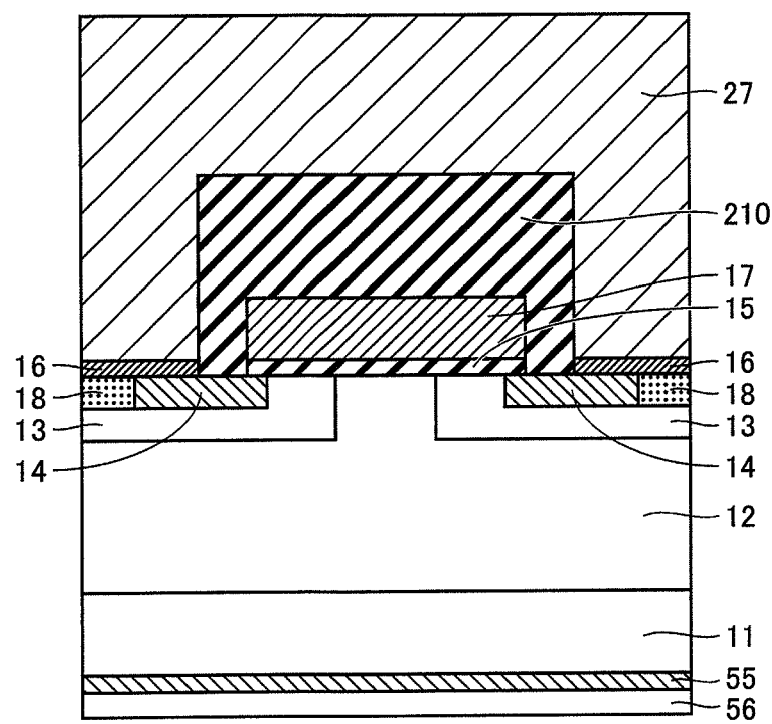
FIG. 11 is a schematic cross-sectional view for illustrating the method of manufacturing a MOSFET in the first embodiment.

Specifically, referring to FIG. 11, source internal interconnection 27 serving as a thin film layer composed of Al is formed, for example, with sputtering, on substantially the entire surfaces of source contact electrode 16 and interlayer insulating film 210. Referring to a MOSFET 200 in FIG. 12, however, for example before a thin film layer of Al is formed, a thin film layer (a thin layer 6) composed of Ti may be formed on substantially the entire surface of source contact electrode 16 or interlayer insulating film 210. Thin layer 6 of Ti thus improves adhesion between source internal interconnection 27 and source contact electrode 16. Alternatively, for example, Ta (tantalum) or W (tungsten) may be used instead of Ti as a material for thin layer 6. Thus, Ta or W improves adhesion between source internal interconnection 27 and source contact electrode 16 as in the case of Ti. In addition, a role as an underlying layer for stopping etching in forming source internal interconnection 27 in a desired pattern in mounting of MOSFET 100 can be provided.

Moreover, thin layer 6 described above may be composed of any one selected from the group consisting of Cr (chromium), Mo (molybdenum), Nb (niobium), and V (vanadium). With any material, thin layer 6 can achieve good adhesion between source contact electrode 16 and source internal interconnection 27 described above, and at the same time, electrical resistance in the source region can sufficiently be lowered and resistance to electromigration can be enhanced.

Figure 12:
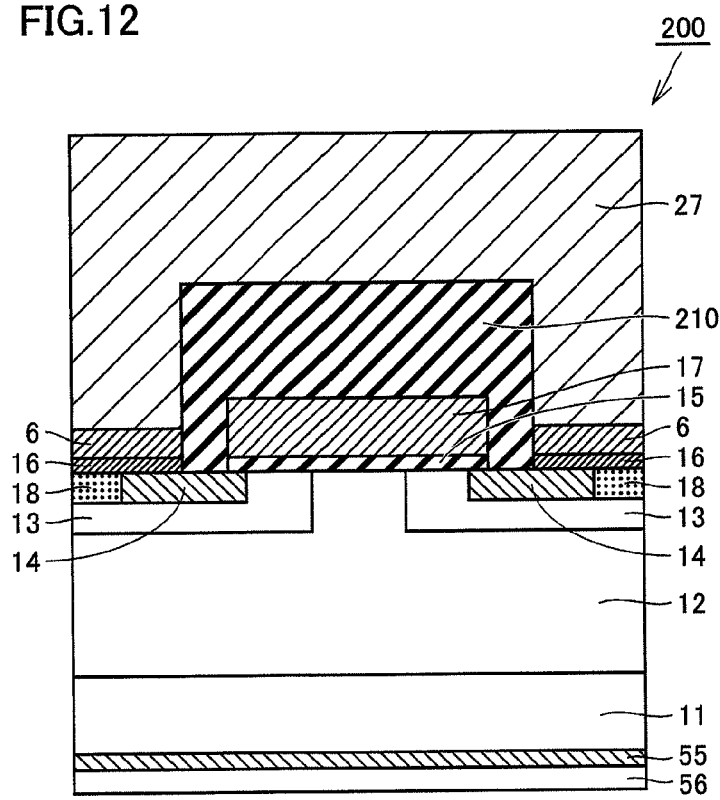
FIG. 12 is a schematic cross-sectional view showing a construction including a thin layer connecting a source contact electrode and a source internal interconnection to each other, in the MOSFET representing the semiconductor device in the first embodiment.

It is noted that MOSFET 200 in FIG. 12 described above is different from MOSFET 100 only in including thin layer 6 and it is constructed otherwise the same as MOSFET 100.

In the step (S100), for example in a case of forming thin film layers of Ti and Al, the thin film layer of Ti has a thickness preferably not smaller than 30 nm and not greater than 70 nm and particularly preferably not smaller than 40 nm and not greater than 60 nm among others, for example, 50 nm. Similarly, the thin film layer of Al preferably has a thickness not smaller than 2 μm.

By performing each step above, MOSFET 100 shown in FIG. 11 (FIG. 1) is formed. In order to electrically connect a plurality of MOSFETs 100 to one another for use as one integrated circuit, the step of forming a passivation film or mounting is performed as a subsequent step. The passivation film is formed as a protection film for finally externally protecting MOSFET 100 once constituent elements of MOSFET 100 are formed.

(Second Embodiment)

Figure 13:
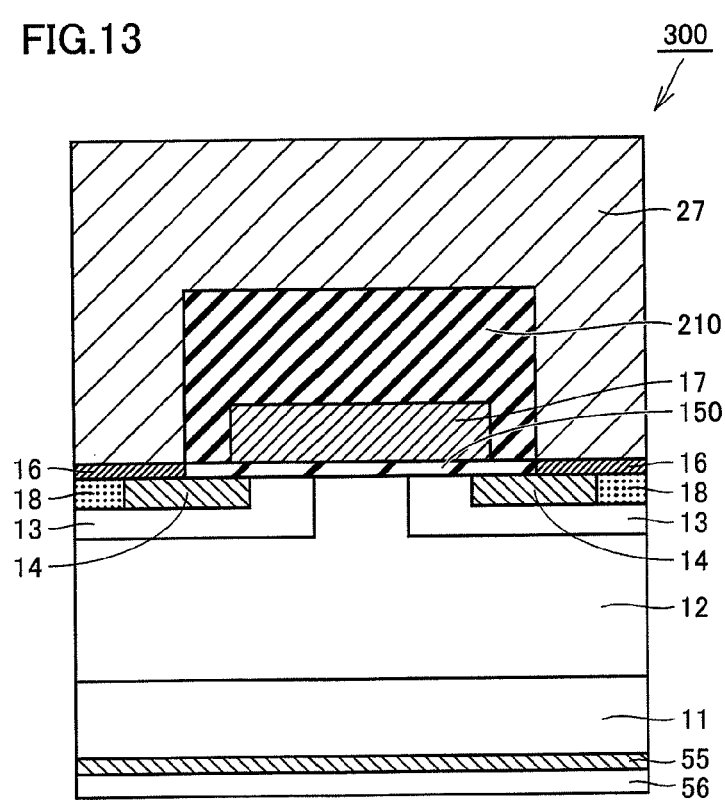
FIG. 13 is a schematic cross-sectional view showing a construction of a MOSFET representing a semiconductor device in a second embodiment.

Referring to FIG. 13, a MOSFET 300 in the second embodiment is basically constructed similarly to MOSFET 100. In MOSFET 300, however, gate oxide film 15 in MOSFET 100 is replaced with a gate insulating film 150 formed of Si$_x$N$_y$.

Gate insulating film 150 contains no oxygen atom. Therefore, for example, even if gate insulating film 150 is constructed to be in contact with source contact electrode 16 in a partial region thereof, gate insulating film 150 does not alter during heat treatment due to reaction to source contact electrode 16. Thus, interlayer insulating film 210 in MOSFET 300 is not arranged in a region lying between gate oxide film 15 and source contact electrode 16 as in the case of interlayer insulating film 210 in MOSFET 100. Therefore, gate insulating film 150 in MOSFET 300 is longer in a lateral direction in FIG. 13 than gate oxide film 15 in MOSFET 100, and end portions in the lateral direction of gate insulating film 150 are in contact with respective source contact electrodes 16. MOSFET 300 having the construction as above also achieves an effect the same as that of MOSFET 100 or MOSFET 200. A method of manufacturing MOSFET 300 in the present second embodiment will be described hereinafter.

The method of manufacturing MOSFET 300 in the second embodiment can be described with reference to the flowchart in FIG. 2. A detailed procedure in each step, however, is slightly different.

Figure 14:
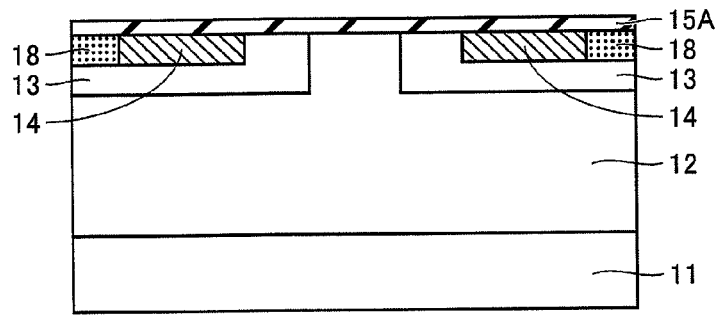
FIG. 14 is a schematic cross-sectional view for illustrating a method of manufacturing a MOSFET in the second embodiment.

The step (S10) to the step (S32) in the flowchart in FIG. 2 are the same as in the first embodiment. Referring to FIG. 14, in the extremely thin insulating film formation step (S33), extremely thin insulating film 15A (corresponding to extremely thin insulating film 15A in FIG. 5) composed of $Si_xN_y$ instead of $SiO_2$ in the first embodiment is formed. This extremely thin insulating film 15A is partially removed in a subsequent step and serves as gate insulating film 150.

Figure 15:
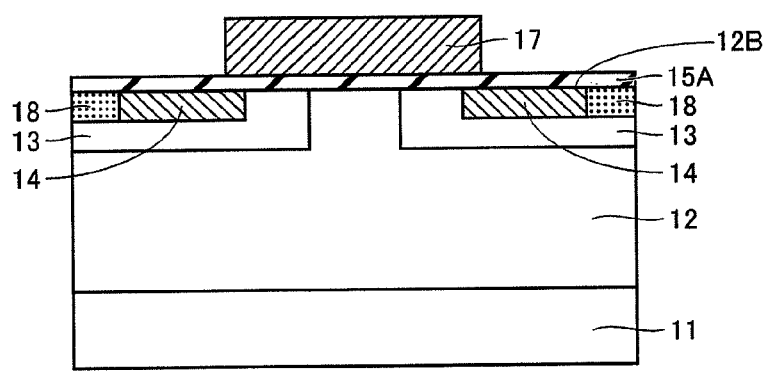
FIG. 15 is a schematic cross-sectional view for illustrating the method of manufacturing a MOSFET in the second embodiment.

In the gate electrode formation step (S40), referring to FIG. 15, gate electrode 17 is formed as in the first embodiment. In this step (S40), gate insulating film 150 may be subjected to the photolithography technique or the like so as to process a length of gate insulating film 150 in a direction along second main surface 12B (the lateral direction in FIG. 15) to a desired length, however, the state shown in FIG. 15 may be established without necessarily performing the process above. This is because, in the case of MOSFET 300, the gate insulating film is equal to a subsequently formed interlayer insulating film in length in the lateral direction above.

Figure 16:
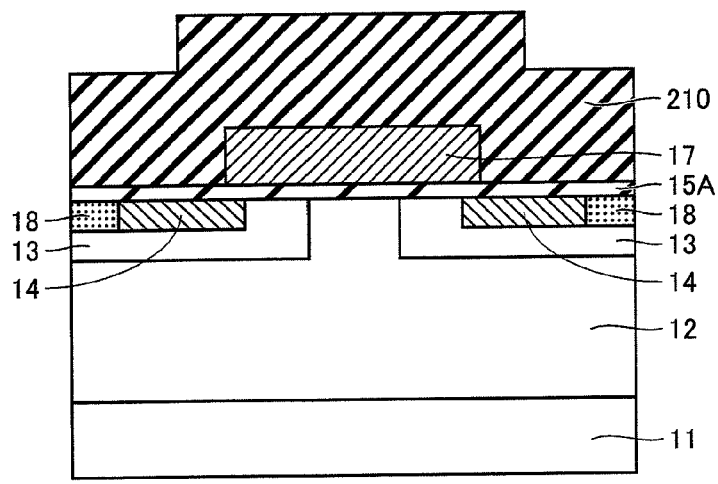
FIG. 16 is a schematic cross-sectional view for illustrating the method of manufacturing a MOSFET in the second embodiment.
Figure 17:
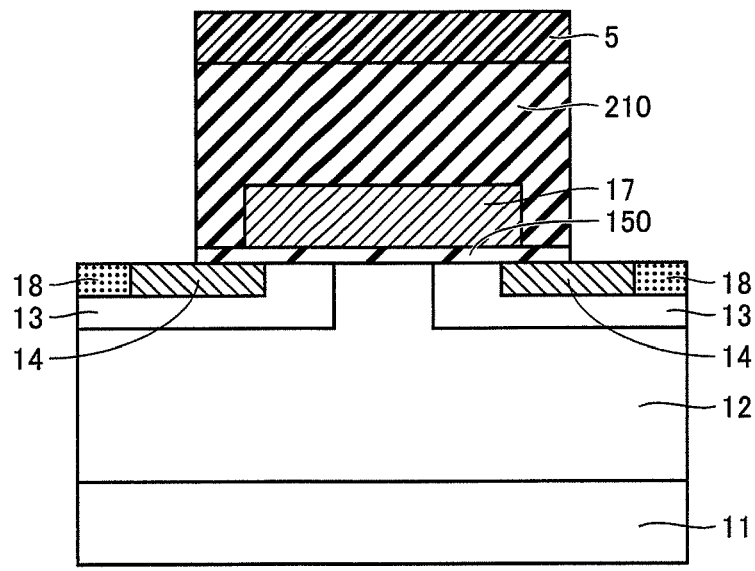
FIG. 17 is a schematic cross-sectional view for illustrating the method of manufacturing a MOSFET in the second embodiment.

In the interlayer insulating film formation step (S50), referring to FIG. 16, interlayer insulating film 210 is formed as in the first embodiment, and thereafter, in the source electrode portion opening step (S60), treatment the same as in the first embodiment is performed. Thus, referring to FIG. 17, such a process that interlayer insulating film 210 and gate insulating film 150 are made equal to each other in length in the lateral direction can be performed.

Figure 18:
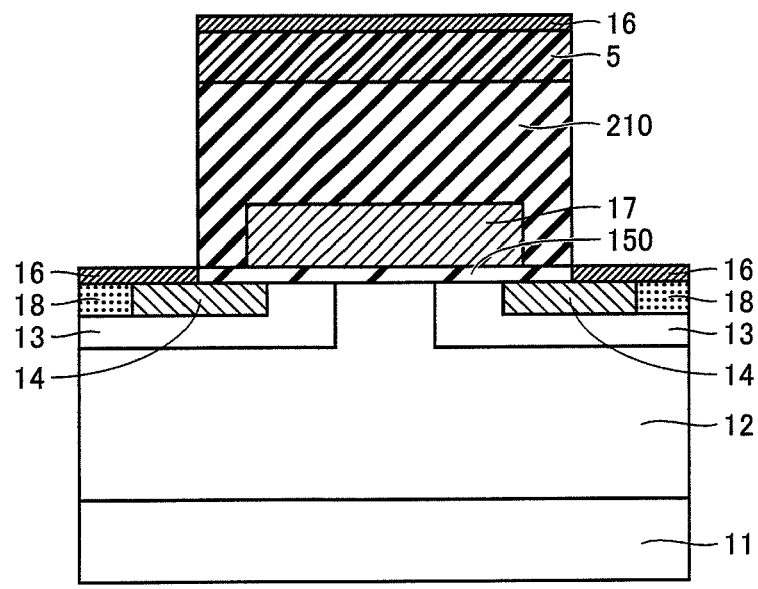
FIG. 18 is a schematic cross-sectional view for illustrating the method of manufacturing a MOSFET in the second embodiment.
Figure 19:
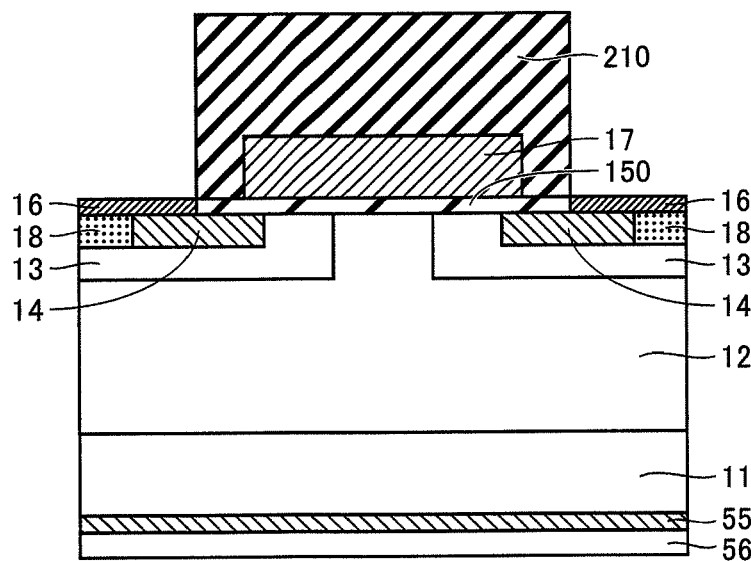
FIG. 19 is a schematic cross-sectional view for illustrating the method of manufacturing a MOSFET in the second embodiment.
Figure 20:
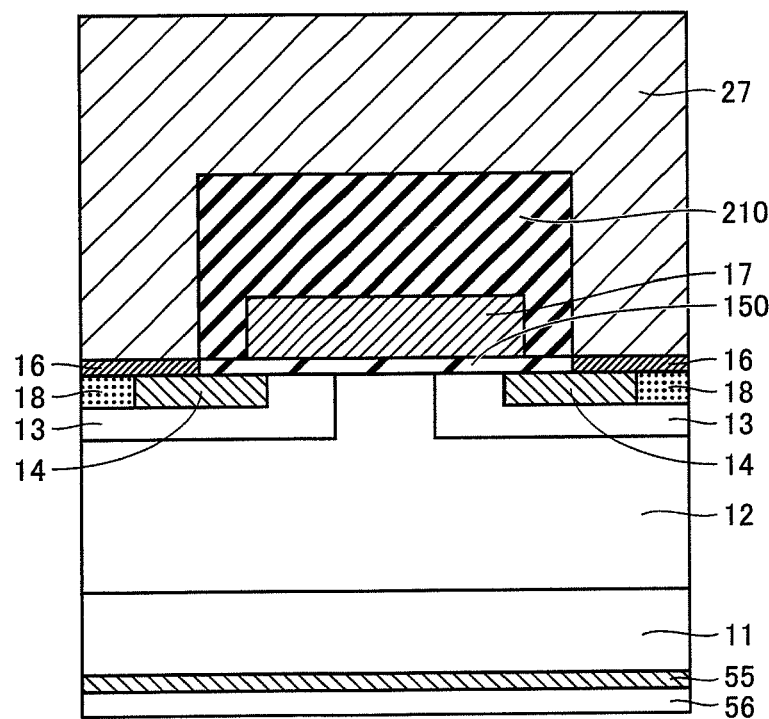
FIG. 20 is a schematic cross-sectional view for illustrating the method of manufacturing a MOSFET in the second embodiment.

The following step (S70) to the step (S100) are treatment the same as in the first embodiment. The step (S70) can be explained with reference to FIG. 18 and it is a manner similar to FIG. 9 in the first embodiment. The step (S80) can be explained with reference to FIG. 19 and it is a manner similar to that in FIG. 10 in the first embodiment. The step (S90) can be explained with reference to FIGS. 18 and 19 and it is a manner similar to that in FIGS. 9 and 10 in the first embodiment. The step (S100) can be explained with reference to FIG. 20 and it is a manner similar to that in FIG. 11 in the first embodiment.

The present second embodiment is different from the present first embodiment only in each point described above. Namely, the second embodiment is fully in conformity with the first embodiment in the construction, the condition, the procedure, the effect, and the like that are not described above.

(Third Embodiment)

Figure 21:
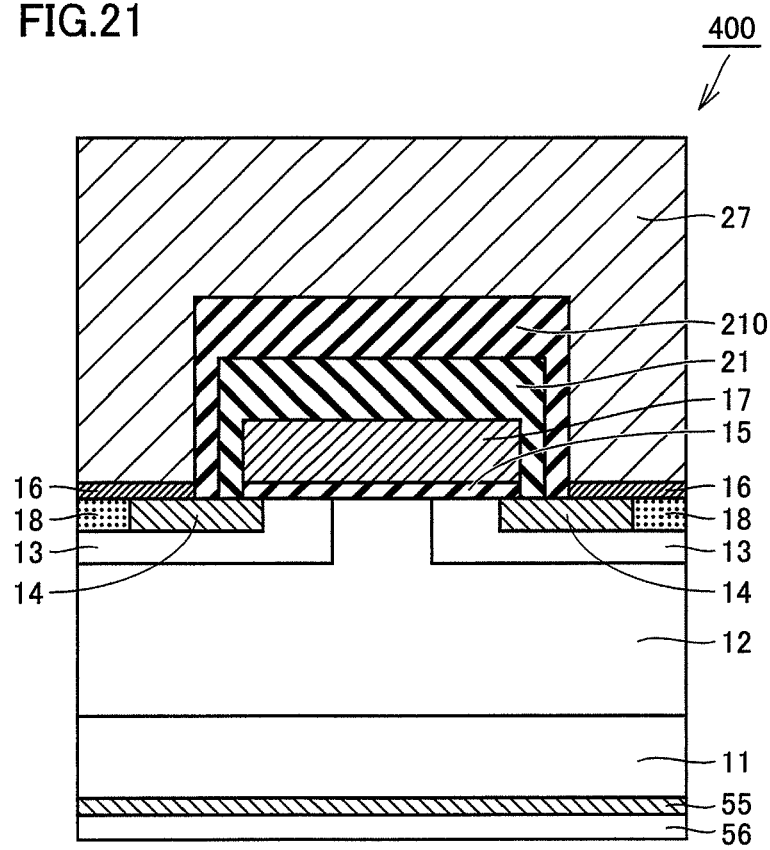
FIG. 21 is a schematic cross-sectional view showing a construction of a MOSFET representing a semiconductor device in a third embodiment.

Referring to FIG. 21, a MOSFET 400 in the third embodiment is basically constructed similarly to MOSFET 100. In MOSFET 400, however, the interlayer insulating film has a two-layered structure of interlayer insulating film 21 composed of $SiO_2$ and interlayer insulating film 210 composed of $Si_xN_y$.

Specifically, in the interlayer insulating film having the two-layered structure, interlayer insulating film 21 composed of $SiO_2$ is arranged inside so as to cover the outer peripheral portion of gate electrode 17, and interlayer insulating film 210 composed of $Si_xN_y$ is arranged to cover the outer peripheral portion of interlayer insulating film 21. In addition, gate oxide film 15 of MOSFET 400 is composed of $SiO_2$. A length of gate oxide film 15 in the lateral direction is equal to a length of gate electrode 17 in the lateral direction. Moreover, end portions in the lateral direction of gate oxide film 15 are surrounded by interlayer insulating film 21, and a region where interlayer insulating film 21 surrounds gate oxide film 15 is surrounded by interlayer insulating film 210.

In a case having such a construction as well, interlayer insulating film 21 or gate oxide film 15 composed of $SiO_2$ is not in contact with source contact electrode 16 formed by alloying Al. Namely, since interlayer insulating film 210 composed of $Si_xN_y$ is arranged, interlayer insulating film 21 (gate oxide film 15) and source contact electrode 16 are discontinuous to each other. Thus, MOSFET 400 having the construction as above also achieves an effect the same as that of MOSFET 100 or the like. A method of manufacturing MOSFET 400 in the present third embodiment will be described hereinafter.

The method of manufacturing MOSFET 400 in the third embodiment can be described with reference to the flowchart in FIG. 2. A detailed procedure in each step, however, is slightly different.

The step (S10) to the step (S40) in the flowchart in FIG. 2 are the same as in the first embodiment. Thus, such a process that gate oxide film 15 and gate electrode 17 are made equal to each other in length in the lateral direction can be performed.

Figure 22:
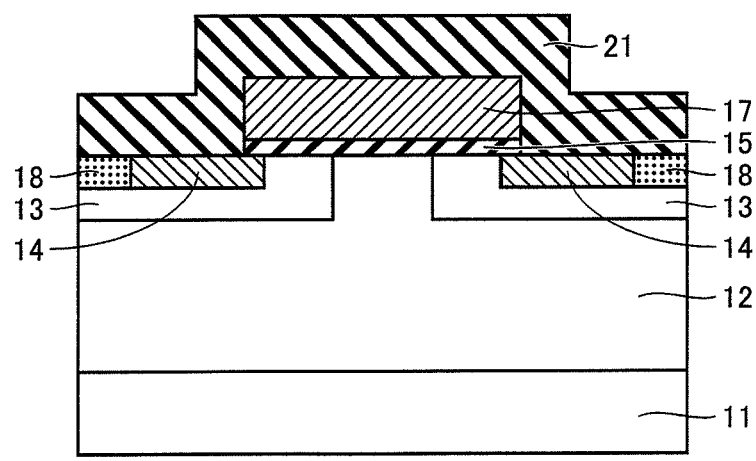
FIG. 22 is a schematic cross-sectional view for illustrating a method of manufacturing a MOSFET in the third embodiment.

In the interlayer insulating film formation step (S50), referring to FIG. 22, initially, interlayer insulating film 21 composed of $SiO_2$ is formed, for example, with CVD (Chemical Vapor Deposition), in particular with plasma CVD here. A thickness is not smaller than 0.5 μm and not greater than 1.5 μm and preferably not smaller than 0.8 μm and not greater than 1.2 μm, for example, 1.0 μm.

Figure 23:
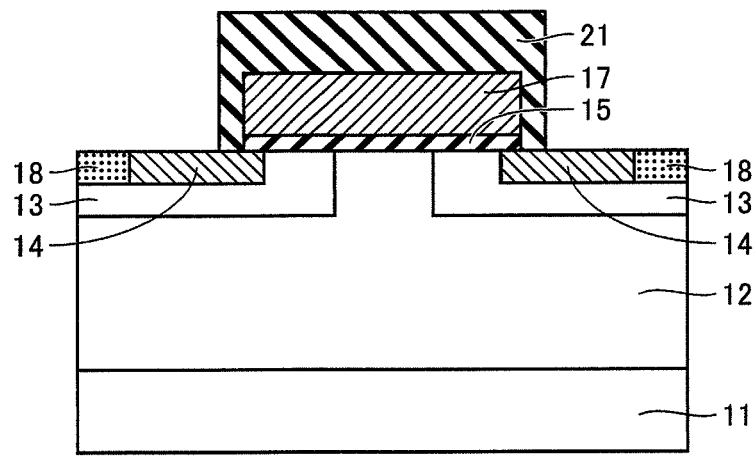
FIG. 23 is a schematic cross-sectional view for illustrating the method of manufacturing a MOSFET in the third embodiment.

Then, the source electrode portion opening step (S60) is once performed. Here, as in the first embodiment, a part of interlayer insulating film 21 formed in the step (S50) is removed. By removing interlayer insulating film 21 in contact with each of n$^+$ source region 14 and p$^+$ region 18 formed inside the pair of p bodies 13, a manner as shown in FIG. 23 is obtained.

Then, the interlayer insulating film formation step (S50) is again performed. Here, interlayer insulating film 210 composed of $Si_xN_y$ is formed in contact with the respective surfaces of p$^+$ region 18, n$^+$ source region 14 and interlayer insulating film 21. It is noted that interlayer insulating film 210 composed of any of $SiO_xN_y$, SiOF and SiOC described above instead of $Si_xN_y$ may be formed as interlayer insulating film 210 to be formed here. A thickness is not smaller than 0.1 μm and not greater than 1.0 μm and preferably not smaller than 0.2 μm and not greater than 0.6 μm, for example, 0.3 μm.

Figure 24:
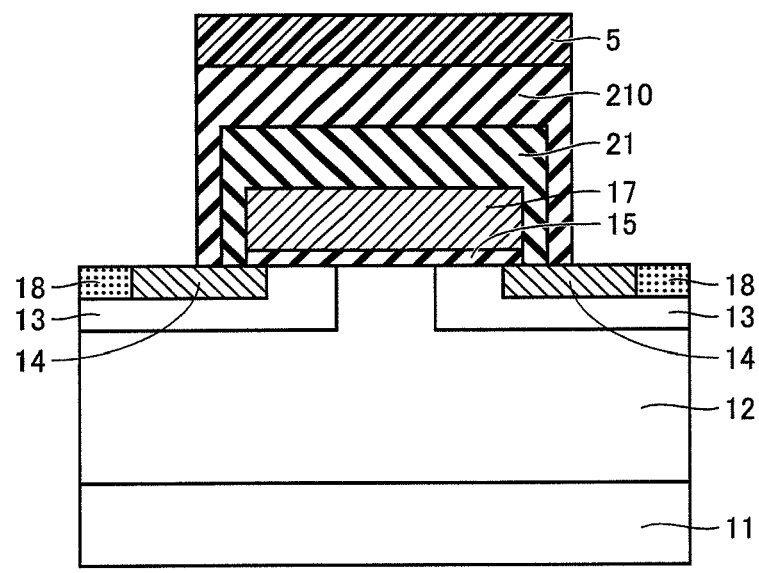
FIG. 24 is a schematic cross-sectional view for illustrating the method of manufacturing a MOSFET in the third embodiment.

Then, the source electrode portion opening step (S60) is again performed. In this step, as in the first embodiment, a part of interlayer insulating film 210 is removed by using a pattern of mask layer 5 as a mask. Thus, referring to FIG. 24, the pattern of mask layer 5 is left in contact with remaining interlayer insulating film 210.

Figure 25:
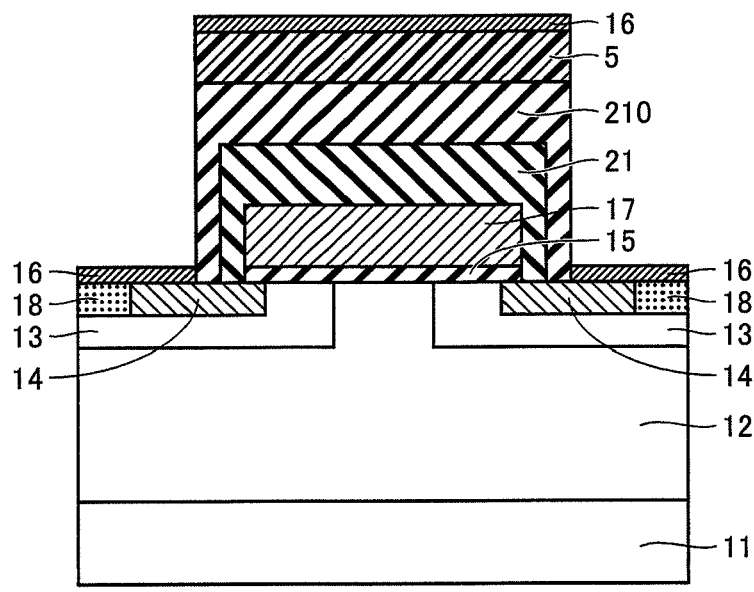
FIG. 25 is a schematic cross-sectional view for illustrating the method of manufacturing a MOSFET in the third embodiment.
Figure 26:
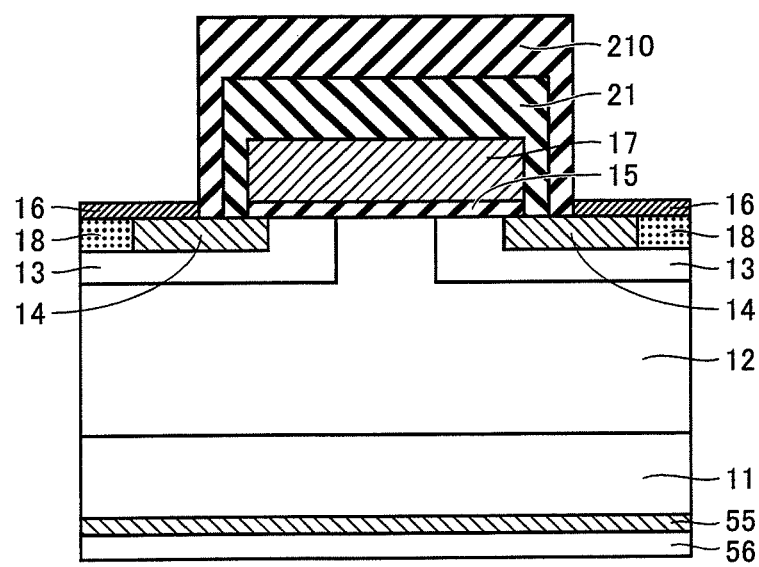
FIG. 26 is a schematic cross-sectional view for illustrating the method of manufacturing a MOSFET in the third embodiment.
Figure 27:
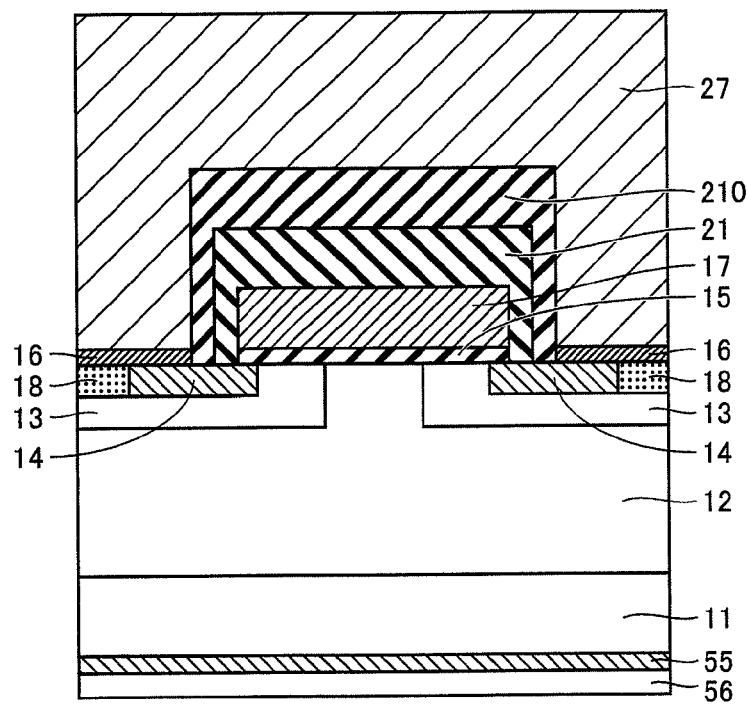
FIG. 27 is a schematic cross-sectional view for illustrating the method of manufacturing a MOSFET in the third embodiment.

The following step (S70) to the step (S100) are treatment the same as in the first embodiment. The step (S70) can be explained with reference to FIG. 25 and it is a manner similar to that in FIG. 9 in the first embodiment. The step (S80) can be explained with reference to FIG. 26 and it is a manner similar to that in FIG. 10 in the first embodiment. The step (S90) can be explained with reference to FIGS. 25 and 26 and it is a manner similar to that in FIGS. 9 and 10 in the first embodiment. The step (S100) can be explained with reference to FIG. 27 and it is a manner similar to that in FIG. 11 in the first embodiment.

The present third embodiment is different from the present first embodiment only in each point described above. Namely, the third embodiment is fully in conformity with the first embodiment in the construction, the condition, the procedure, the effect, and the like that are not described above.

(Fourth Embodiment)

Figure 28:
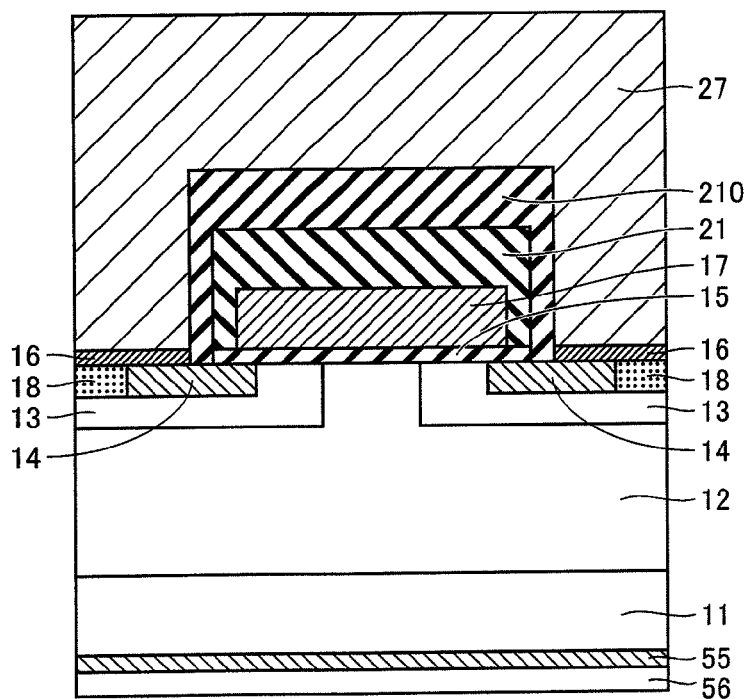
FIG. 28 is a schematic cross-sectional view showing a construction of a MOSFET representing a semiconductor device in a fourth embodiment.

Referring to FIG. 28, a MOSFET 500 in the fourth embodiment is basically constructed similarly to MOSFET 400. In MOSFET 500, however, for example as in MOSFET 300 described above, gate oxide film 15 is longer in length in the lateral direction than gate electrode 17, and its length is equal to a length in the lateral direction of interlayer insulating film 21 composed of $SiO_2$. End portions in the lateral direction of gate oxide film 15 are in contact with interlayer insulating film 210 composed of $Si_xN_y$.

MOSFET 500 is different from MOSFET 400 only in length in the lateral direction of gate oxide film 15 described above. Namely, in MOSFET 500 as well, interlayer insulating film 21 or gate oxide film 15 composed of $SiO_2$ is not in contact with source contact electrode 16 formed by alloying Al. Namely, since interlayer insulating film 210 composed of $Si_xN_y$ is arranged, interlayer insulating film 21 (gate oxide film 15) and source contact electrode 16 are discontinuous to each other. Thus, MOSFET 500 having the construction as above also achieves an effect the same as that of MOSFET 100 or the like.

A method of manufacturing MOSFET 500 in the fourth embodiment can be described with reference to the flowchart in FIG. 2. The step (S10) to the step (S40) in the flowchart in FIG. 2 are the same as in the second embodiment. Namely, it is not necessary to process a length of gate oxide film 15 to a desired length in the step (S40). The present fourth embodiment, however, is different from the second embodiment in that gate insulating film 150 composed of $Si_xN_y$ is formed in the second embodiment but gate oxide film 15 composed of $SiO_2$ is formed in the present fourth embodiment.

Figure 29:
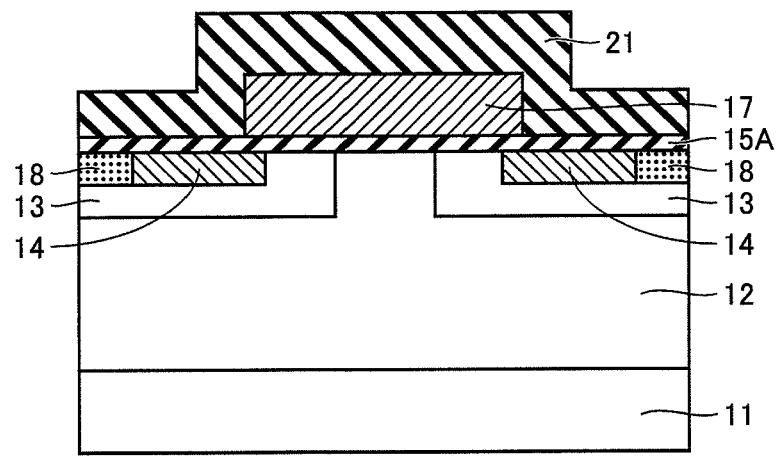
FIG. 29 is a schematic cross-sectional view for illustrating a method of manufacturing a MOSFET in the fourth embodiment.
Figure 30:
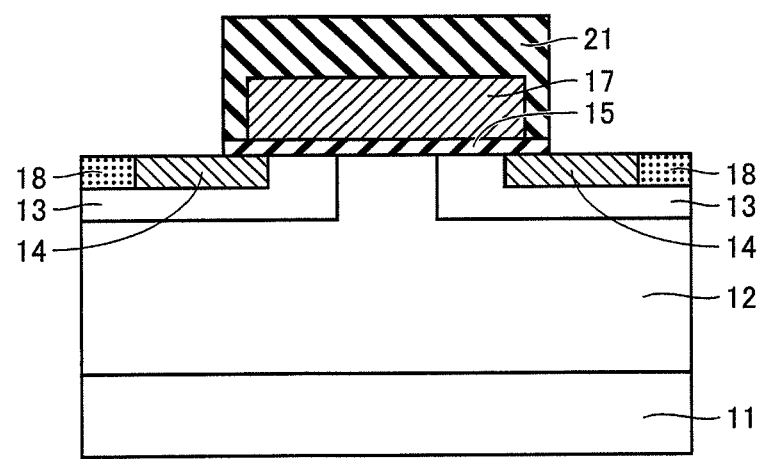
FIG. 30 is a schematic cross-sectional view for illustrating the method of manufacturing a MOSFET in the fourth embodiment.

In the interlayer insulating film formation step (S50), referring to FIG. 29, as in the third embodiment, interlayer insulating film 21 composed of $SiO_2$ is formed. Then, the source electrode portion opening step (S60) is once performed. Here, referring to FIG. 30, as in the step (S60) in the second embodiment, extremely thin insulating film 15A formed in contact with $n^+$ source region 14 and $p^+$ region 18 and interlayer insulating film 21 are removed and extremely thin insulating film 15A serves as gate oxide film 15. Thus, such a process that interlayer insulating film 21 and gate oxide film 15 are made equal to each other in length in the lateral direction can be performed.

Figure 31:
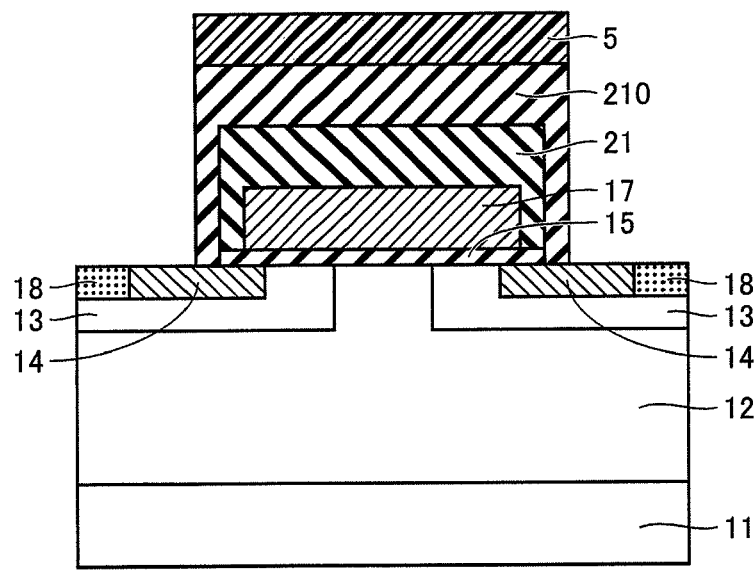
FIG. 31 is a schematic cross-sectional view for illustrating the method of manufacturing a MOSFET in the fourth embodiment.

Then, as the step (S50) and the step (S60) are again performed as in the third embodiment, referring to FIG. 31, a pattern of mask layer 5 is formed in contact with remaining interlayer insulating film 210.

Figure 32:
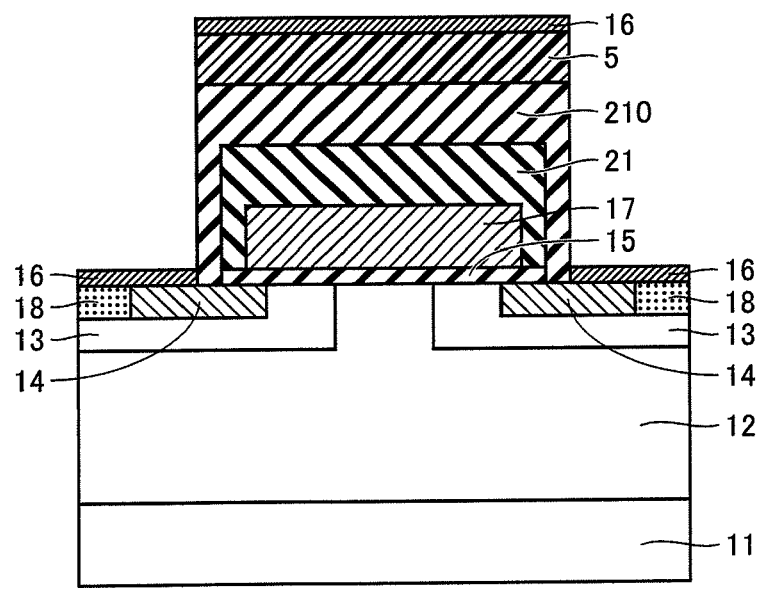
FIG. 32 is a schematic cross-sectional view for illustrating the method of manufacturing a MOSFET in the fourth embodiment.
Figure 33:
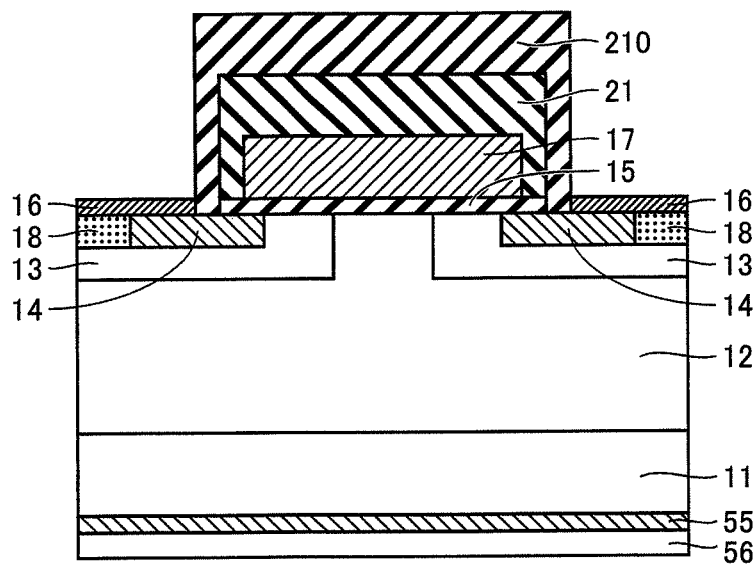
FIG. 33 is a schematic cross-sectional view for illustrating the method of manufacturing a MOSFET in the fourth embodiment.
Figure 34:
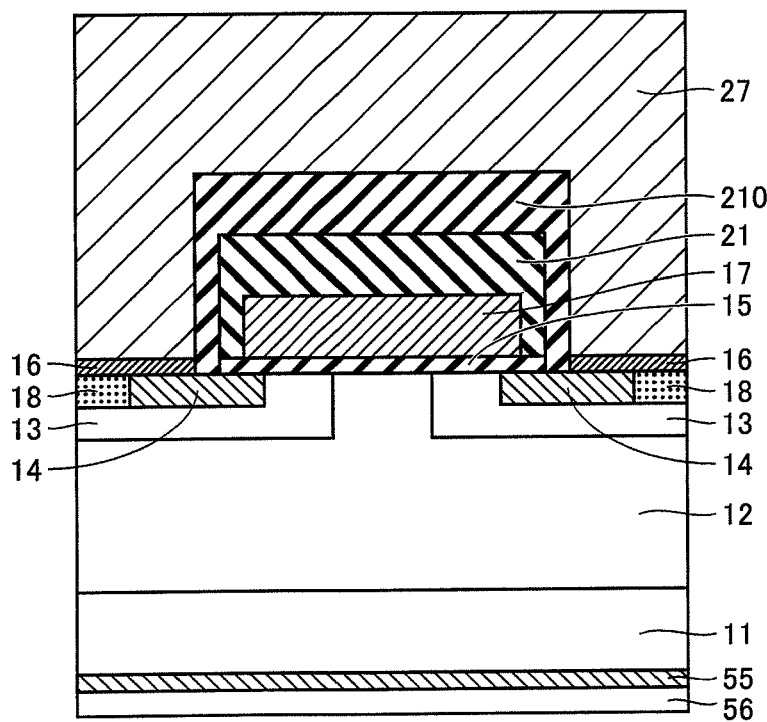
FIG. 34 is a schematic cross-sectional view for illustrating the method of manufacturing a MOSFET in the fourth embodiment.

The following step (S70) to the step (S100) are treatment the same as in the first embodiment. The step (S70) can be explained with reference to FIG. 32 and it is a manner similar to that in FIG. 9 in the first embodiment. The step (S80) can be explained with reference to FIG. 33 and it is a manner similar to that in FIG. 10 in the first embodiment. The step (S90) can be explained with reference to FIGS. 32 and 33 and it is a manner similar to that in FIGS. 9 and 10 in the first embodiment. The step (S100) can be explained with reference to FIG. 34 and it is a manner similar to that in FIG. 11 in the first embodiment.

The present fourth embodiment is different from the present first embodiment only in each point described above. Namely, the fourth embodiment is fully in conformity with the first embodiment in the construction, the condition, the procedure, the effect, and the like that are not described above.

(Fifth Embodiment)

Figure 35:
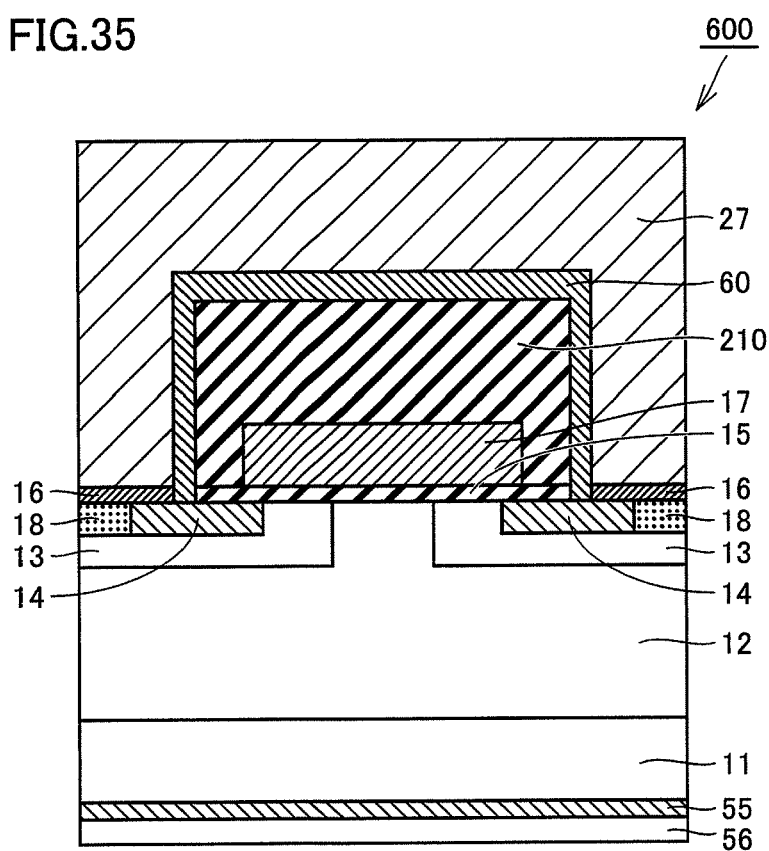
FIG. 35 is a schematic cross-sectional view showing a construction of a MOSFET representing a semiconductor device in a fifth embodiment.

Referring to FIG. 35, a MOSFET 600 in the fifth embodiment is basically constructed similarly to the MOSFET in each embodiment described above. In MOSFET 600, however, a barrier layer 60 is arranged to cover the outer periphery of interlayer insulating film 210 composed of $Si_xN_y$. Barrier layer 60 is arranged also between source contact electrode 16 and gate oxide film 15. MOSFET 600 is different from other MOSFETs described above in this regard.

Likewise interlayer insulating film 210 (interlayer insulating film 21), for example, barrier layer 60 has a function to electrically isolate source internal interconnection 27 arranged to connect one source contact electrode 16 and the other source contact electrode 16 to each other in FIG. 35 from gate electrode 17 as well as to protect MOSFET 600. In addition, for example, likewise thin layer 6 in FIG. 12 described above, barrier layer 60 can have a function to improve adhesion between source internal interconnection 27 and interlayer insulating film 210 or can play a role as an underlying layer for stopping etching in forming source internal interconnection 27 in a desired pattern in mounting of MOSFET 600. In order to play the role above, barrier layer 60 is preferably composed, for example, of Ta (tantalum), W (tungsten), or oxide or carbide thereof.

In MOSFET 600 having the construction as above as well, $SiO_2$ and alloyed Al in source contact electrode 16 are not in contact with each other. Therefore, an effect the same as in the MOSFET in each embodiment described above is obtained. In addition to this effect, an effect originating from the presence of barrier layer 60 described above is additionally obtained.

Figure 36:
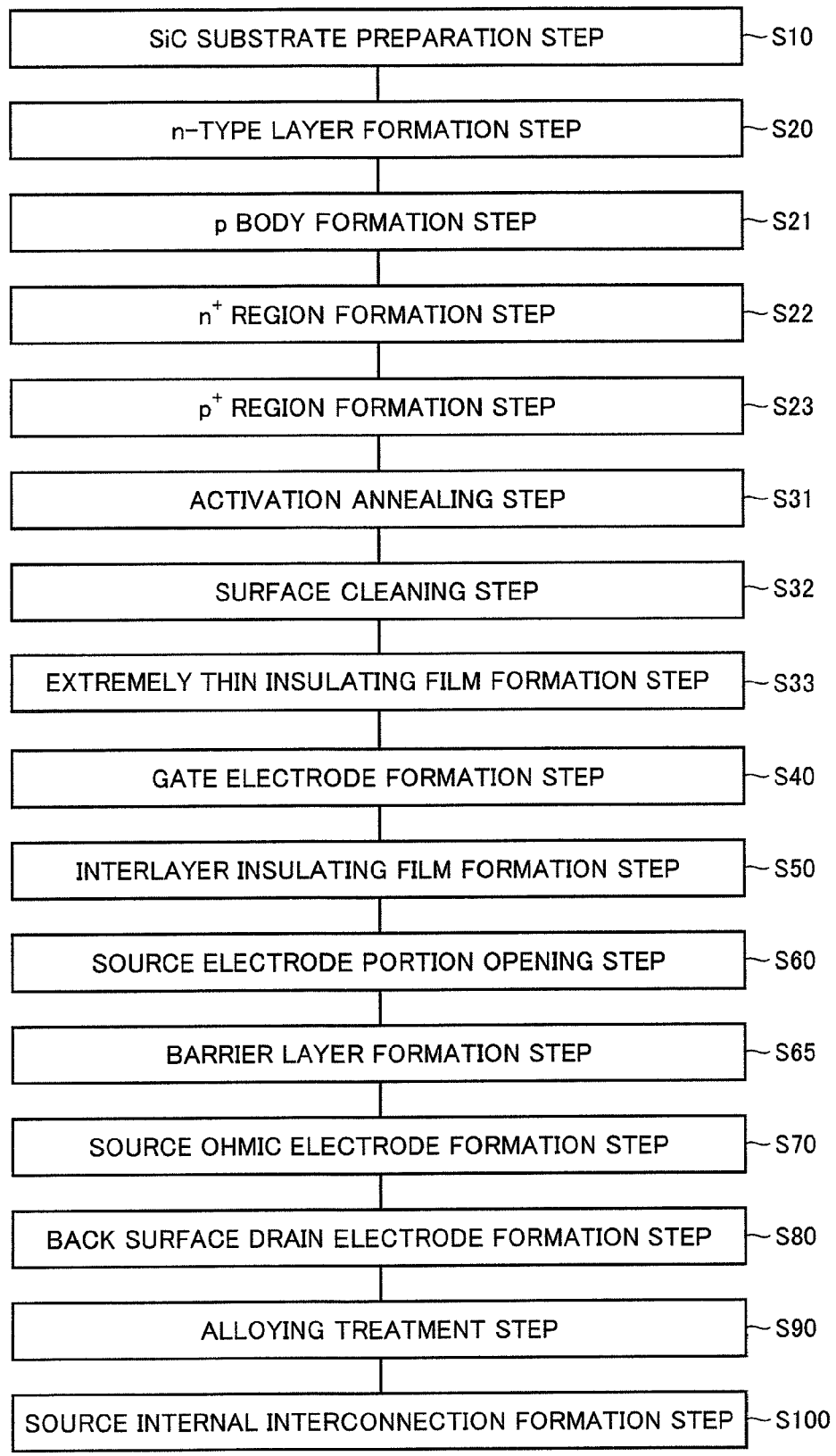
FIG. 36 is a flowchart showing outlines of a method of manufacturing a MOSFET in the fifth embodiment.

A method of manufacturing MOSFET 600 in the fifth embodiment can be described with reference to a flowchart in FIG. 36. The flowchart in FIG. 36 is basically similar to the flowchart in FIG. 2, however, the flowchart in FIG. 36 includes a barrier layer formation step (S65) between the source electrode portion opening step (S60) and the source ohmic electrode formation step (S70).

The step (S10) to the step (S60) in the method of manufacturing MOSFET 600 are substantially the same as those for the MOSFET according to each embodiment described above. For example, referring to FIG. 37, gate oxide film 15 is an oxide film composed of $SiO_2$, and a length in the lateral direction of gate oxide film 15 is greater than a length in the lateral direction of gate electrode 17 and equal to a length in the lateral direction of interlayer insulating film 210. Therefore, for example in the source electrode portion opening step (S60) as in the second embodiment, gate oxide film 15 is preferably partially removed simultaneously with removal of a part of interlayer insulating film 210.

In the present fifth embodiment, however, a resist (for example, mask layer 5 in FIG. 8) used for partially removing interlayer insulating film 210 or gate oxide film 15 in the step (S60) is preferably removed before proceeding to the subsequent step.

Figure 37:
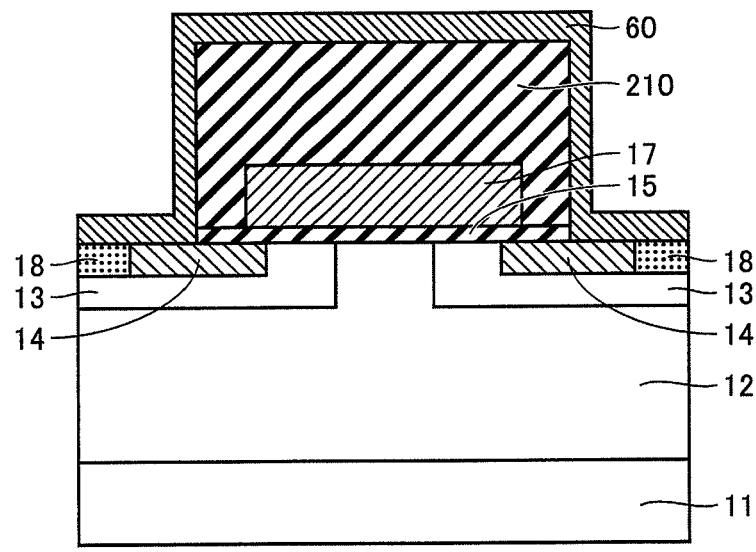
FIG. 37 is a schematic cross-sectional view for illustrating the method of manufacturing a MOSFET in the fifth embodiment.

Then, in the barrier layer formation step (S65), as shown in FIG. 37, barrier layer 60 is formed in contact with the respective main surfaces of $p^+$ region 18 and $n^+$ source region 14, so as to surround end portions of gate oxide film 15 and to cover the outer peripheral portion of interlayer insulating film 210. Barrier layer 60 has a thickness preferably not smaller than 0.1 μm and not greater than 0.5 μm and more preferably not smaller than 0.05 μm and not greater than 0.2 μm among others, for example, 0.1 μm.

Figure 38:
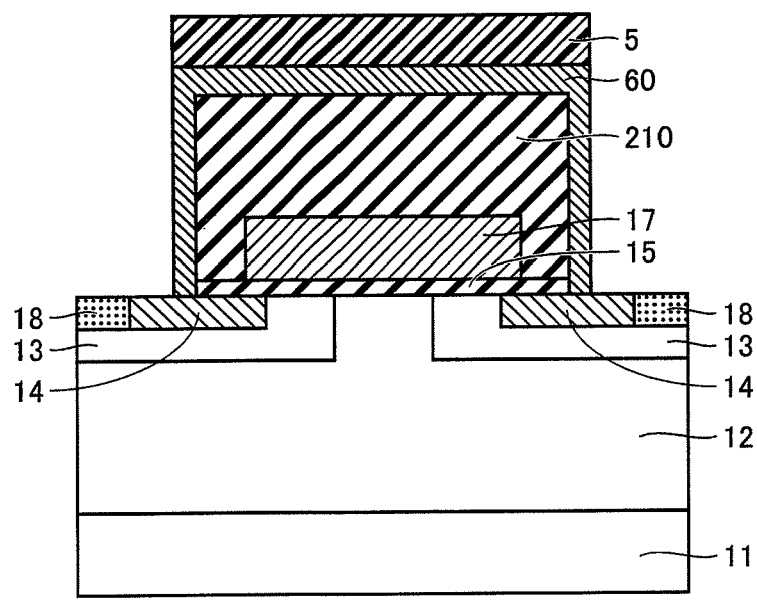
FIG. 38 is a schematic cross-sectional view for illustrating the method of manufacturing a MOSFET in the fifth embodiment.

Then, after the resist is applied onto the surface of barrier layer 60 above, exposure and development are performed to form a resist film having an opening in a region in conformity with a desired shape of a portion from which barrier layer 60 is to be removed. Then, using the resist film as a mask, barrier layer 60 is partially removed, for example, through RIE. Specifically, referring to FIG. 38, barrier layer 60 formed in contact with p$^+$ region 18 and n$^+$ source region 14 is removed. Then, a pattern of mask layer 5 is left in contact with remaining barrier layer 60.

Then, referring to FIG. 36, the source ohmic electrode formation step (S70) is performed. In this step (S70), source contact electrode 16 as in each embodiment described above is formed. Specifically, referring to FIG. 39, initially, the Ti film, the Al film and the Si film described above are formed, for example, with sputtering particularly on the main surface of p$^+$ region 18 and the main surface of n$^+$ source region 14, that are exposed in second main surface 12B, as well as on mask layer 5 formed in contact with barrier layer 60. Thereafter, by removing mask layer 5, the Ti film, the Al film and the Si film described above on mask layer 5 are also removed. Thus, the Ti film, the Al film and the Si film are formed only on the main surface of p$^+$ region 18 and the main surface of n$^+$ source region 14. Lift-off is thus preferably performed to form a desired film on mask layer 5 formed in the step (S65) and to form a film only in a desired region by subsequently removing mask layer 5.

Figure 39:
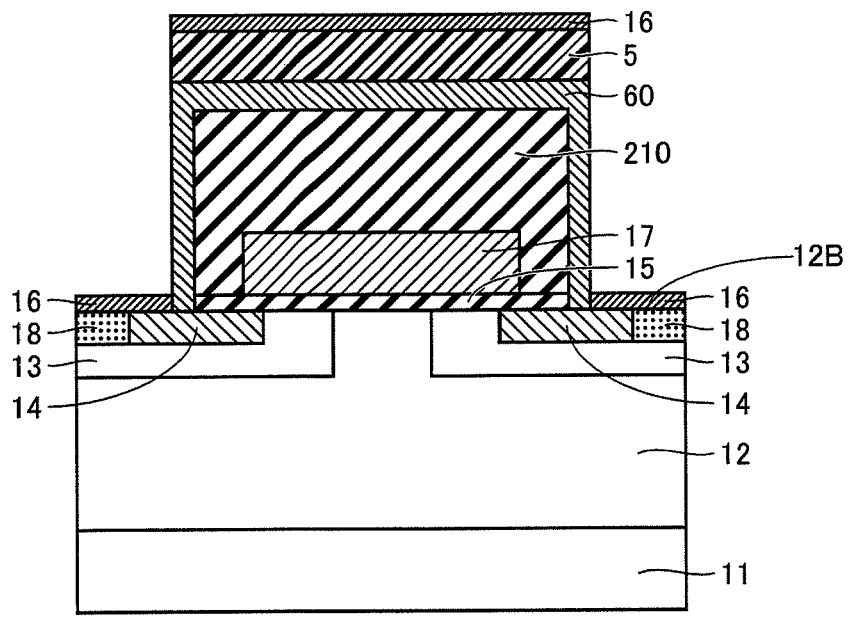
FIG. 39 is a schematic cross-sectional view for illustrating the method of manufacturing a MOSFET in the fifth embodiment.

In FIG. 39 as well, for example as in FIG. 9, a stack structure constituted of the Ti film composed of Ti, the Al film composed of Al, and the Si film composed of Si for forming the source ohmic electrode is drawn as source contact electrode 16.

Figure 40:
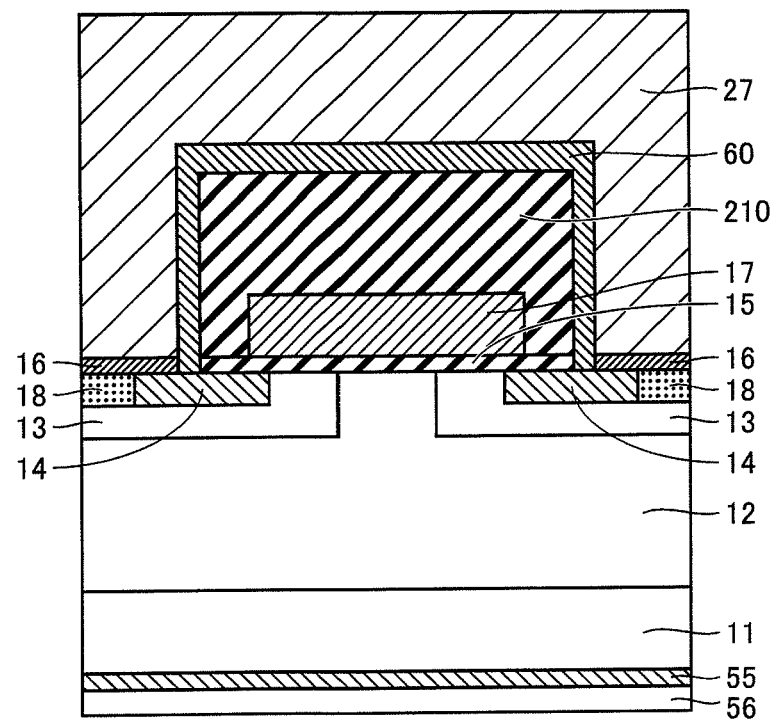
FIG. 40 is a schematic cross-sectional view for illustrating the method of manufacturing a MOSFET in the fifth embodiment.

The following steps (S80) to (S100) are in conformity with those in each embodiment described above. MOSFET 600 in a manner shown in FIG. 40 (FIG. 35) is thus formed.

The present fifth embodiment is different from the present first embodiment only in each point described above. Namely, the fifth embodiment is fully in conformity with the first embodiment in the construction, the condition, the procedure, the effect, and the like that are not described above.

(Sixth Embodiment)

Figure 41:
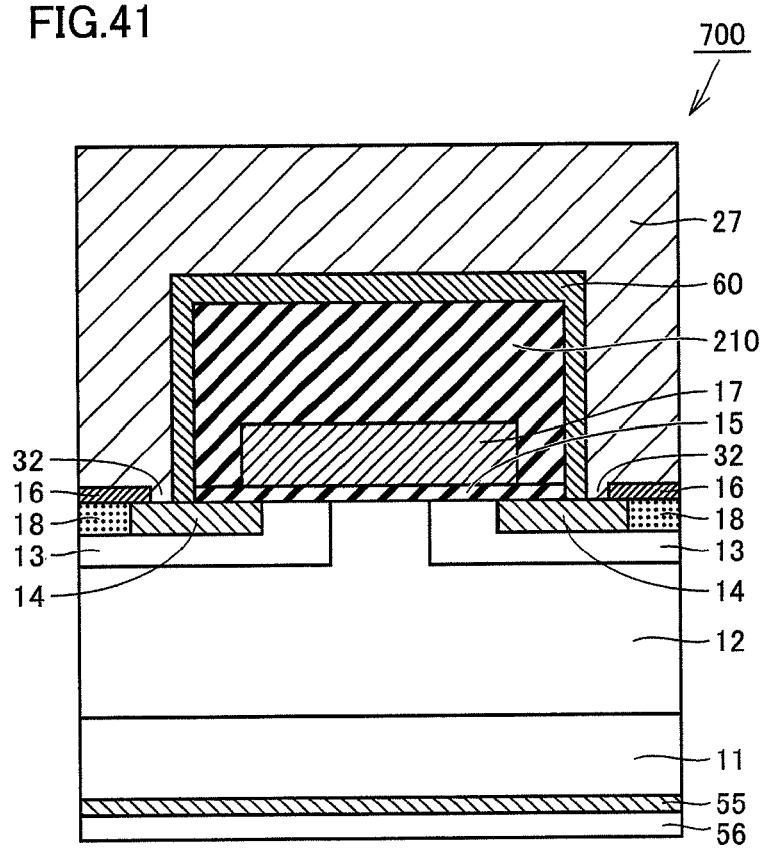
FIG. 41 is a schematic cross-sectional view showing a construction of a MOSFET representing a semiconductor device in a sixth embodiment.

Referring to FIG. 41, a MOSFET 700 in the sixth embodiment is basically constructed similarly to MOSFET 600. In MOSFET 700, however, source contact electrode 16 and barrier layer 60 are discontinuous to each other and a gap 32 is present therebetween. MOSFET 700 is different from MOSFET 600 only in this regard.

By thus arranging gap 32 between source contact electrode 16 and gate oxide film 15, reaction between Al in source contact electrode 16 and oxygen atoms in gate oxide film 15 can further reliably be suppressed. It is noted that gap 32 preferably has a width (a width of gap 32 in a direction along the main surface of the n$^+$ SiC substrate), for example, not smaller than 0.1 μm and not greater than 1 μm, for the following reasons. Namely, an insulating gate transistor as described above is normally arranged in a cell structure having a lateral width, for example, around 10 μm, and therefore an extent of occupation by gap 32, which is not an operating region, is desirably not greater than 1 μm. In addition, taking into account process accuracy in an etching process for forming gate oxide film 15 or the like, gap 32 above desirably has a width not smaller than 0.1 μm.

A method of manufacturing MOSFET 700 in the sixth embodiment can be described with reference to the flowchart in FIG. 36.

The method of manufacturing MOSFET 700 is different from the method of manufacturing MOSFET 600 in the source ohmic electrode formation step (S70). As described above, in the method of manufacturing MOSFET 600, lift-off is preferably performed in the step (S70) by using mask layer 5 formed in contact with barrier layer 60 in the step (S65). In the method of manufacturing MOSFET 700, however, preferably, mask layer 5 remaining on barrier layer 60 in the step (S65) is removed, and source contact electrode 16 is formed by using a new mask layer 7 formed to cover barrier layer 60 and a part of the main surface of n$^+$ source region 14 in the step (S70).

Figure 42:
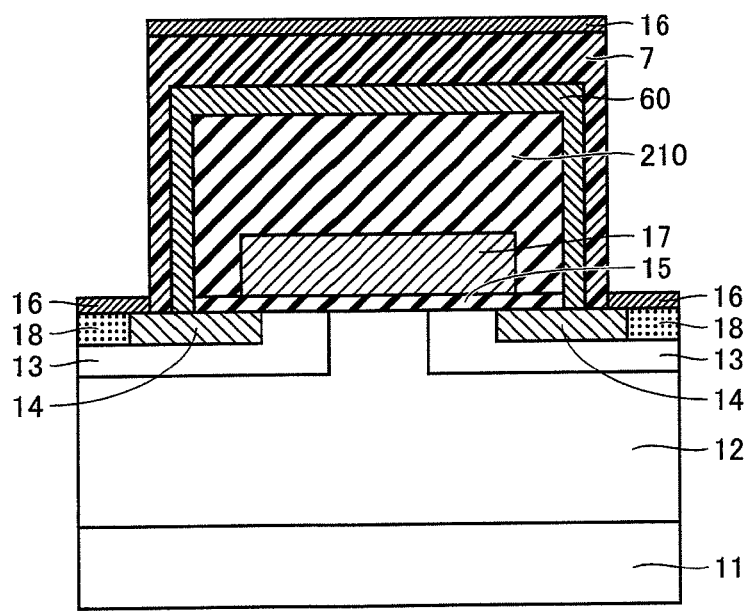
FIG. 42 is a schematic cross-sectional view for illustrating a method of manufacturing a MOSFET in the sixth embodiment.

Specifically, referring to FIG. 42, after the resist is applied onto the main surfaces of p$^+$ region 18 and n$^+$ source region 14 and onto the outer peripheral surface of barrier layer 60, exposure and development are performed so as to form a resist film covering a certain distance from an outer frame of barrier layer 60 on the main surface of n$^+$ source region 14. This resist film refers to mask layer 7 shown in FIG. 42. Thereafter, the Ti film, the Al film and the Si film are formed, for example, with sputtering, as in each embodiment described above, on the upper surface of mask layer 7 in FIG. 42 and on the exposed respective surfaces of n$^+$ source region 14 and p$^+$ region 18.

Thereafter, by removing mask layer 7 (and the Ti film and the like formed on the upper surface of mask layer 7), the Ti film and the like are formed with gap 32 being interposed with respect to barrier layer 60. By alloying this Ti film and the like in the step (S80), satisfactory treatment can be performed without reaction to gate oxide film 15.

Figure 43:
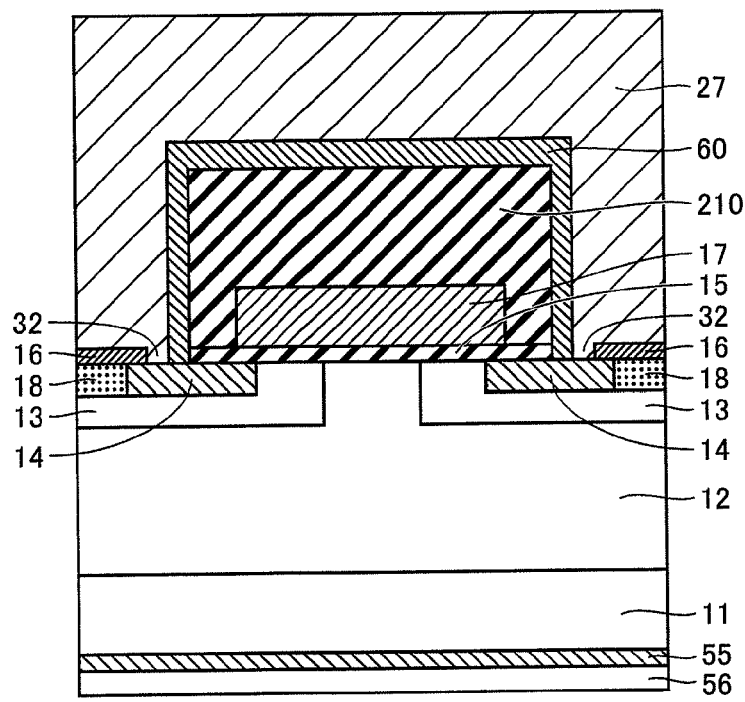
FIG. 43 is a schematic cross-sectional view for illustrating the method of manufacturing a MOSFET in the sixth embodiment.

The following steps (S80) to (S100) are in conformity with those in each embodiment described above. MOSFET 700 in a manner shown in FIG. 43 (FIG. 40) is thus formed.

The present sixth embodiment is different from the present fifth embodiment only in each point described above. Namely, the sixth embodiment is fully in conformity with the fifth embodiment in the construction, the condition, the procedure, the effect, and the like that are not described above.

(Seventh Embodiment)

Figure 44:
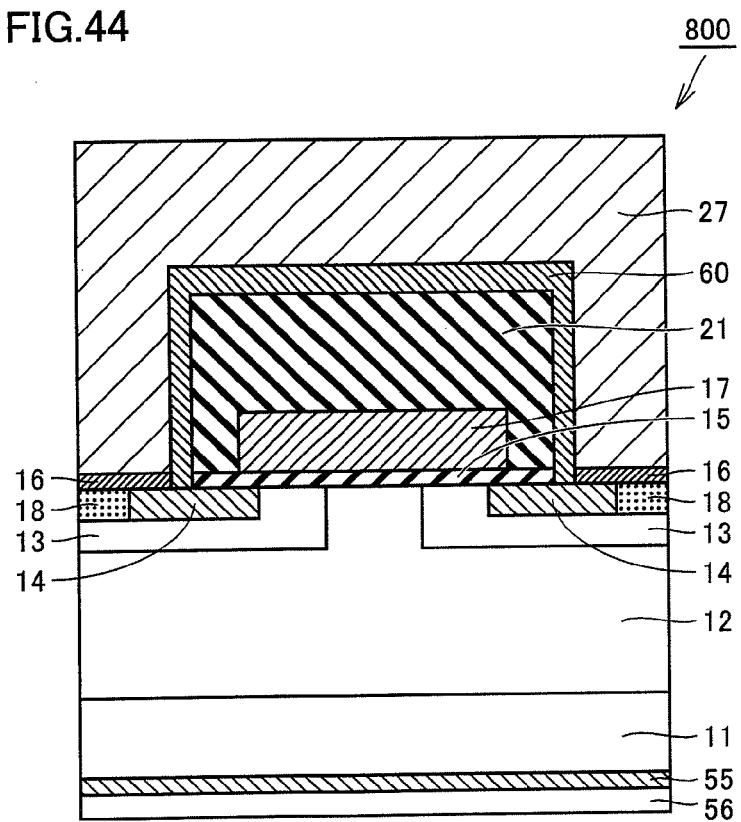
FIG. 44 is a schematic cross-sectional view showing a construction of one MOSFET representing a semiconductor device in a seventh embodiment.
Figure 45:
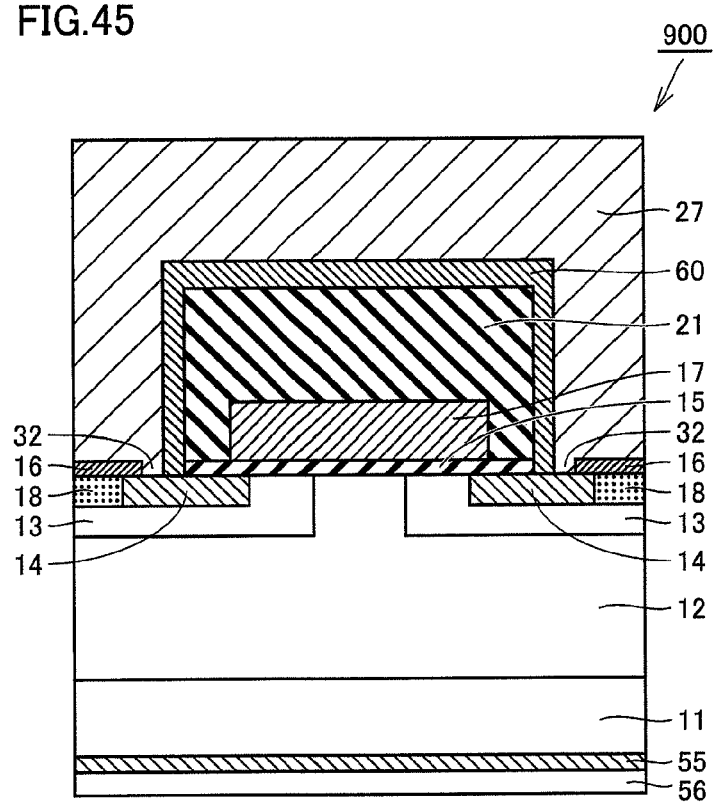
FIG. 45 is a schematic cross-sectional view showing a construction of another MOSFET representing a semiconductor device in the seventh embodiment.

Referring to FIG. 44, a MOSFET 800 in the seventh embodiment is basically constructed similarly to MOSFET 600. In MOSFET 800, however, instead of interlayer insulating film 210 composed, for example, of Si$_x$N$_y$, interlayer insulating film 21 composed of SiO$_2$ is employed. MOSFET 800 is different from MOSFET 600 only in this regard above. Similarly, referring to FIG. 45, a MOSFET 900 in the present seventh embodiment is basically constructed similarly to MOSFET 700. In MOSFET 900, however, instead of interlayer insulating film 210 composed, for example, of Si$_x$N$_y$, interlayer insulating film 21 composed of SiO$_2$ is employed. MOSFET 900 is different from MOSFET 700 only in this regard above.

In MOSFETs 800 and 900 above as well, barrier layer 60 lies between source contact electrode 16 and interlayer insulating film 21 or gate oxide film 15. Therefore, even when interlayer insulating film 21 and gate oxide film 15 composed of SiO$_2$ are included, reduction reaction between Al in source contact electrode 16 and oxygen atoms can be suppressed.

Figure 46:
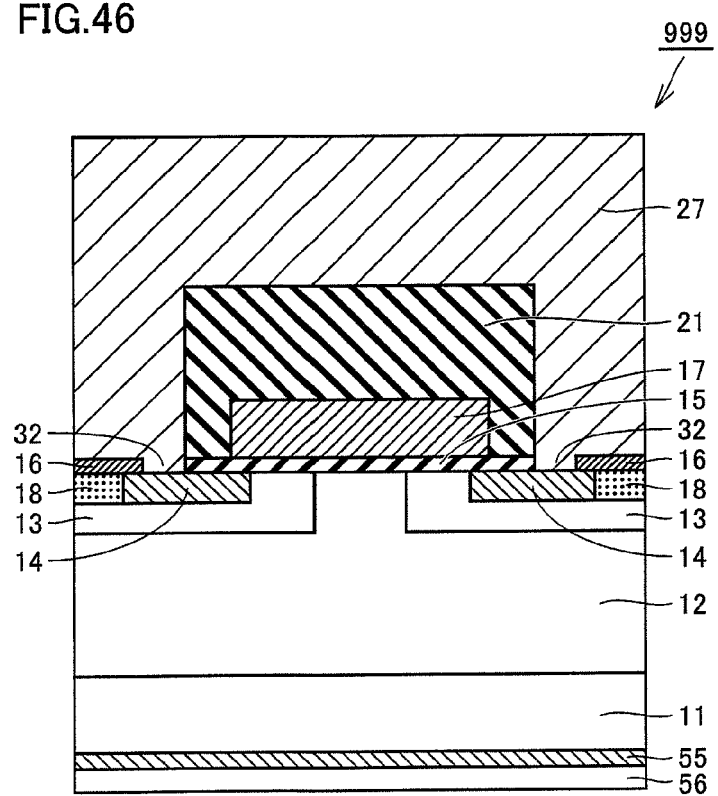
FIG. 46 is a schematic cross-sectional view showing a construction of yet another MOSFET representing a semiconductor device in the seventh embodiment.

In addition, such a construction that a barrier layer is not provided but interlayer insulating film 21 and gate oxide film 15 composed of SiO$_2$ are employed and then gap 32 is provided between source contact electrode 16 and gate oxide film 15, for example, as in MOSFET 700 described above, is also possible, like a MOSFET 999 in FIG. 46. In this case as well, owing to the presence of gap 32, reduction reaction between oxygen atoms in gate oxide film 15 and interlayer insulating film 21 and Al due to heating for alloying source contact electrode 16 can be suppressed.

The method of manufacturing each MOSFET in the seventh embodiment above is implemented by combining as appropriate the methods of manufacturing a MOSFET in the embodiments described above. The present seventh embodiment is different from each embodiment described above only in the regard described above.

Although each embodiment of the present invention has been described above, it should be understood that each embodiment disclosed herein is illustrative and non-restrictive in every respect. The scope of the present invention is defined by the terms of the claims, and is intended to include any modifications within the scope and meaning equivalent to the terms of the claims.

Industrial Applicability

The present invention is particularly excellent as a technique for suppressing reaction between an alloyed electrode capable of coming in contact with both of an n-type SiC region and a p-type SiC region and an oxide film.

Description Of The Reference Signs

5, 7 mask layer; 6 thin layer; 11 n$^+$ SiC substrate; 11A one main surface; 11B the other main surface; 12 n$^-$ SiC layer; 12A first main surface; 12B second main surface; 13 p body; 14 n$^+$ source region; 15 gate oxide film; 15A extremely thin insulating film; 16 source contact electrode; 17 gate electrode; 18 p$^+$ region; 21, 210 interlayer insulating film; 27 source internal interconnection; 32 gap; 55 drain electrode; 56 drain contact electrode; 60 barrier layer; 100, 200, 300, 400, 500, 600, 700, 800, 900, 999, 1000 MOSFET; and 150 gate insulating film.

The invention claimed is:

1. A semiconductor device, comprising:
   an SiC layer;
   an ohmic electrode formed on a main surface of said SiC layer, wherein the ohmic electrode is one alloy layer containing Al;
   another electrode arranged at a distance from said ohmic electrode on said main surface of said SiC layer;
   an insulating layer located between said ohmic electrode and said another electrode, and a first impurity region of first conductivity type and a second impurity region of second conductivity type, which are formed in the SiC layer;
   wherein the ohmic electrode can ohmically contact both of the first impurity region and the second impurity region;
   wherein the ohmic electrode is formed so as to overlap both of the first impurity region and the second impurity region when viewed along a direction perpendicular to the main surface of the SiC layer; and
   a rate of lowering in electric resistance in said insulating layer being not higher than 5% when heating to a temperature not higher than 1200° C. is carried out while said ohmic electrode and said insulating layer are adjacent to each other, wherein the rate of lowering in electric resistance in said insulating layer is calculated according to the equation $(a-b)/a$, wherein a denotes an electric resistance value of the insulating layer before heating to a temperature not higher than 1200° C., and wherein b denotes an electric resistance value of the insulating layer after heating to a temperature not higher than 1200° C.

2. The semiconductor device according to claim 1, wherein said insulating layer is an interlayer insulating film for electrically isolating said ohmic electrode and said another electrode from each other, and at least a surface of said interlayer insulating film opposed to said ohmic electrode is composed of silicon nitride or silicon oxynitride.

3. The semiconductor device according to claim 1, further comprising an extremely thin insulating film having a thickness not smaller than 30 nm and not greater than 100 nm between said SiC layer and said another electrode, wherein
   a combination of said extremely thin insulating film and said insulating layer is spaced apart from said ohmic electrode by a gap.

4. A semiconductor device, comprising:
   an SiC layer having a first impurity region of a first conductivity type and a second impurity region of a second conductivity type;
   an ohmic electrode formed on a main surface of said SiC layer, wherein the ohmic electrode is one alloy layer containing Al, wherein the ohmic electrode is formed so as to overlap both of the first impurity region and the second impurity region when viewed along a direction perpendicular to the main surface of the SiC layer, wherein the ohmic electrode can ohmically contact both the first impurity region and the second impurity region;
   another electrode arranged at a distance from said ohmic electrode on said main surface of said SiC layer; and
   an insulating layer located between said ohmic electrode and said another electrode, and
   said insulating layer including
      an interlayer insulating film for electrically isolating said ohmic electrode and said another electrode from each other, and
      a barrier layer arranged to cover an outer periphery of said interlayer insulating film, wherein a portion of said interlayer insulating film faces to the ohmic electrode, and wherein the barrier layer is arranged to cover the portion of said interlayer insulating film so that the portion of the insulating layer faces to the ohmic electrode with the barrier layer therebetween,
   wherein the barrier layer is formed so as to reach the main surface of the SiC layer.

5. The semiconductor device according to claim 4, wherein said barrier layer is formed of tungsten, tantalum, or oxide or carbide thereof.

6. The semiconductor device according to claim 4, further comprising an extremely thin insulating film having a thickness not smaller than 30 nm and not greater than 100 nm between said SiC layer and said another electrode, wherein
   a combination of said extremely thin insulating film and said insulating layer is spaced apart from said ohmic electrode by a gap.

* * * * *